(12) United States Patent
Sugiura et al.

(10) Patent No.: US 7,145,171 B2
(45) Date of Patent: Dec. 5, 2006

(54) PROBE UNIT AND ITS MANUFACTURING METHOD

(75) Inventors: Masahiro Sugiura, Hamamatsu (JP); Toshitaka Yoshino, Hamamatsu (JP); Shuichi Sawada, Hamamatsu (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 346 days.

(21) Appl. No.: 10/832,315

(22) Filed: Apr. 27, 2004

(65) Prior Publication Data

US 2004/0217350 A1 Nov. 4, 2004

(30) Foreign Application Priority Data

May 1, 2003 (JP) ............................ 2003-126390
Mar. 30, 2004 (JP) ............................ 2004-097492

(51) Int. Cl.
 *H01L 23/58* (2006.01)
(52) U.S. Cl. ...................... 257/48; 438/14; 324/765; 324/754
(58) Field of Classification Search ................. 257/48; 438/14, 17; 324/765, 754, 757
See application file for complete search history.

(56) References Cited

U.S. PATENT DOCUMENTS 4,321,122 A * 3/1982 Whitcomb et al. ......... 204/400

5,723,347 A 3/1998 Hirano et al.
6,211,691 B1 4/2001 Okuno

FOREIGN PATENT DOCUMENTS

| JP | 07-211752 | 8/1995 |
|---|---|---|
| JP | 08-254546 | 10/1996 |
| JP | 2001-116766 | 4/2001 |
| JP | 2001-194386 | 7/2001 |
| JP | 2001-337111 | 12/2001 |
| JP | 2001-343399 | 12/2001 |
| JP | 2002-286755 | 10/2002 |
| KR | 2000-0047410 | 7/2001 |

OTHER PUBLICATIONS

Copy of Korean Office Action dated Aug. 23, 2004 (and English translation of same).

* cited by examiner

*Primary Examiner*—Sara Crane
(74) *Attorney, Agent, or Firm*—Dickstein, Shapiro, Morin & Oshinsky, LLP.

(57) ABSTRACT

A probe unit comprises a flexible substrate made of an inorganic substance and having an almost straight edge, an electro conductive film formed on a surface of the substrate and having a plurality of contact parts aligned on a surface of the edge and can contact with electrodes of a sample and lead parts connected to the contact parts, wherein the substrate is elastically deformed together with the contact part while the plurality of the contacts parts are supported by the edge when a force is added to press a surface of the contact part.

16 Claims, 23 Drawing Sheets

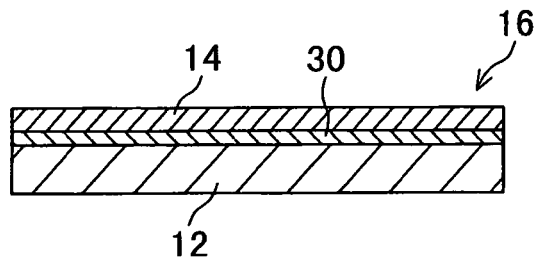
FIG.3A1
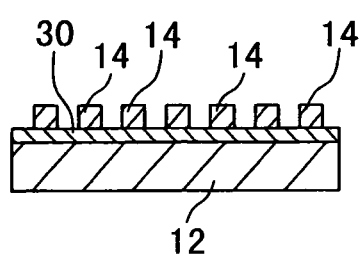
FIG.3B1
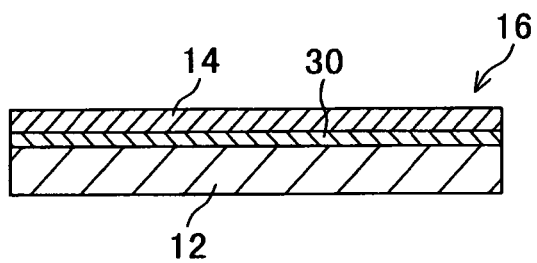
FIG.3A2
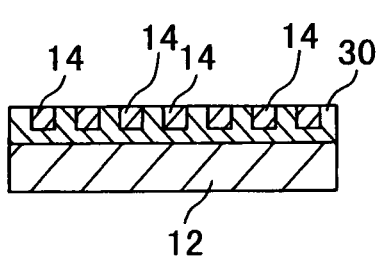
FIG.3B2
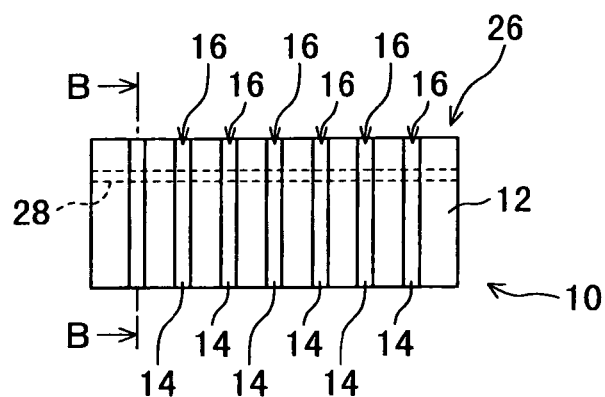
FIG.4A
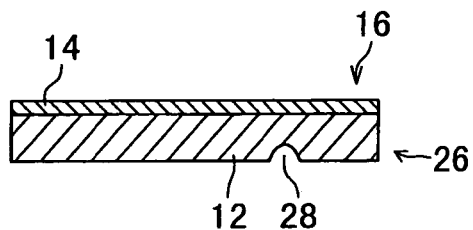
FIG.4B

PROBE UNIT AND ITS MANUFACTURING METHOD

CROSS REFERENCE TO RELATED APPLICATION

This application is based on Japanese Patent Application 2003-126390, filed on May 1, 2003, and Japanese Patent Application 2004-97492, filed on Mar. 30, 2004, the entire contents of which are incorporated herein by reference.

BACKGROUND OF THE INVENTION

A) Field of the Invention

The present invention relates to a probe unit for inspecting an electrical property of electronic devices such as a semiconductor integrated circuit and a liquid crystal panel and manufacturing methods of the probe unit.

B) Description of the Related Art

Conventionally, a probe unit having a probe that contacts with electrodes of a sample and projects tip parts of a large number of leads aligned in a parallel configuration from a substrate is well known. In a probe unit disclosed by Japanese Laid-Open Patent 2002-286755, since microscopic probes project from a substrate, the probe unit can be overdriven without adding large power on the sample, and a plurality of probes can securely be contacted with a plurality of electrodes of the sample at the same time.

On the other hand, in an inspection of the liquid crystal panel for a display device, a reliable inspection result may be obtained by making a contact pressure between electrodes of a sample and the probes large enough. Japanese Laid-Open Patent 7-211752 discloses contact parts as probes does not project from the substrate, a probe unit that can enlarge a contact pressure between electrodes of the sample and the contact parts by using elasticity of a flexible substrate.

However, since slits corresponding to a pitch of the contact parts are formed at the edge of a substrate holding the contact parts in the probe unit disclosed in the Japanese Laid-Open Patent 7-211752, each contact part can be modified independently. Therefore, when each contact part greatly deforms with the substrate being strongly pressed by a bump of electrodes, adjacent contact parts may contact each another. Also, when a width of each edge part of the substrates divided by slits becomes small to the thickness of the substrates, possibility of contacting adjacent contact parts each another may be large because each edge part tends to deform to the width direction.

Also, in the probe unit disclosed in the Japanese Laid-Open Patent 7-211752, the contact parts contacting the electrodes of the substrate and the electro conductive film having the leads and the electrodes are formed along with the edge of the substrate extending to the reverse side. The leads and the contact parts extending to the reverse side are formed with pouched plating covering the tips divided by the slit formed on the edge of the substrate. Because the contact parts and the leads are not formed on the same surface, it will be impossible to conduct the electrodes of the sample and the leads of the probe unit when the contact parts are worn down. Further, because the contact parts of the probe unit are formed on the reverse side of the surface where the leads of the substrate are formed, the leads may be peeled off from the substrate when the substrate are bent by a strong force is impressed on the contact parts.

SUMMARY OF THE INVENTION

It is an object of the present invention to provide a probe unit and its manufacturing method which can make contact pressure of electrodes of a sample large by elasticity of a substrate and which can prevent each contact part from contacting with adjacent contact parts.

Further, it is another object of the present invention to provide a probe unit and its manufacturing method which can make contact pressure of electrodes of a sample large by elasticity of a substrate and which can prevent leads from being peeled off from the substrate.

According to one aspect of the present invention, there is provided a probe unit, comprising: a flexible substrate made of an inorganic substance and having an almost straight edge; an electro conductive film formed on a surface of the substrate and having a plurality of contact parts aligned on a surface of the edge and can contact with electrodes of a sample and lead parts connected to the contact parts, wherein the substrate is elastically deformed together with the contact part while the plurality of the contacts parts are supported by the edge when a force is added to press a surface of the contact part.

When a pressure power is added on the surface of the contact part, the substrate elastically deforms with the contact parts while the contact parts are supported by the edge of the substrate. In the structure wherein the substrate elastically deforms together with the contact parts supported by the straight edge of the substrate, contact pressure between the contact parts and the electrodes of the sample can become large by elasticity of the substrate, further, it can be controlled that a pitch of the contact parts changes when the contact part makes elastic deformation.

Further, by continuously forming the contact parts and the leads on the same surface of the substrate, the leads and the electrodes of the sample can be contacted even if the contact parts are worn down. Also, it is possible to prevent the leads from peeling off from the substrate even if the substrate is deformed along with the contact parts.

Moreover, in the probe unit according to the present invention, it is preferable that the substrate is made of ceramics, especially zirconium with thickness of 500 μm or less is preferred. Because it can be prevented that excessive load is added on the electrode of the sample, reliability of contact between the contact part and the electrode of the sample can be improved by elasticity of the ceramics substrate. Also, since excessive deformation of the substrate can be controlled by the rigidity of a ceramics, exfoliation of the electro conductive film and the substrate can be prevented.

Furthermore, in the probe unit according to the present invention, contact parts can be formed with a simple process by not projecting the contact parts from the edge of the substrate.

Also, in the probe unit according to the present invention, by projecting the contact parts from the edge of the substrate, it will be possible to improve an ability of the contact parts to follow a plurality of electrodes that are waved up and down.

Further, in the probe unit according to the present invention, by covering a surface of the contact part with a metal film that is harder than a base material, friction of the contact part can be controlled.

Still further, in the probe unit according to the present invention, by covering a surface of the contact part with a metal film that has smaller volume resistivity than the base material, wiring resistance can be reduced.

Moreover, in the probe unit according to the present invention, by inclining the surface of the contact part so that it will be almost parallel to the surface of the electrode at a time of pressure welding of contact part to the electrode of the sample, contact area between the contact part and the electrode can be enlarged. Therefore, even if there are a crack and dirt on the surface of the electrode, reliability of electrical connection between the electrode and the contact part can be improved.

According to another aspect of the present invention, there is provided a probe unit, comprising: a flexible substrate made of a non-organic substance and having an almost straight edge; an electro conductive film formed on a surface of the substrate and having a plurality of contact parts arranged to be detached from a surface of the edge and can contact with electrodes of a sample and lead parts connected to the contact parts, wherein the substrate is elastically deformed together with the contact part while the plurality of the contacts parts are supported by the edge when a force is added to press a surface of the contact part.

Further, by continuously forming the contact parts and the leads on the same surface of the substrate, the leads and the electrodes of the sample can be contacted even if the contact parts are worn down. Also, it is possible to prevent the leads from peeling off from the substrate even if the substrate is deformed along with the contact parts.

Moreover, by detaching the contact parts from the surface of the substrate in advance, shearing stress generated between the substrate and the electro conductive film at a time that the substrate elastically deforms with the contact parts can be decreased. Therefore, it is possible to prevent the lead parts of the electro conductive films from peeling off from the substrate.

Furthermore, the edge of the substrate of the probe unit according to the present invention can be elastically deformed together with the contact parts by, for example, fixing the probe unit below a fixture with the edge of the substrate projecting from an edge of the fixture.

According to still another aspect of the present invention, there is provided a method of manufacturing a probe unit, comprising the steps of: (a) preparing a flexible substrate made of an inorganic substance and having an almost straight edge; (b) forming a resist having an opening on a surface of the substrate; and (c) forming an electro conductive film having a plurality of contact parts aligned on a surface of the edge and can contact with electrodes of a sample and lead parts connected to the contact parts in the opening by plating. By forming the electro conductive film by plating using a resist, the contact parts can be miniaturized.

The method of manufacturing a probe unit according to the present invention may include the step of thinning the substrate from a reverse side to make the probe unit thin after the step of plating. By thinning the substrate after the plating step, the electro conductive film can be miniaturized because the resist layer can be formed on a surface of a relatively thick substrate.

Moreover, the method of manufacturing a probe unit according to the present invention may include the step of forming a protection film on the electro conductive film between the steps of plating and thinning. By performing the step of thinning the substrate with the protection film being formed on the surface of the electro conductive film, the electro conductive film can be protected from damage or a stain.

According to further aspect of the present invention, there is provided a method of manufacturing a probe unit, comprising the steps of: (a) preparing a flexible substrate made of an inorganic substance and having an almost straight edge; (b) forming a resist having an opening on a surface of the substrate for exposing at least a part of the surface of the substrate; and (c) forming an electro conductive film formed on a surface of the substrate and having a plurality of contact parts arranged to be detached from a surface of the edge and can contact with electrodes of a sample and lead parts connected to the contact parts in the opening by plating.

By forming the electro conductive film with the plating using the resist, a contact part can be miniaturized. Also, by using the sacrificial layer, the contact part can be formed with a space from the substrate.

BRIEF DESCRIPTION OF THE DRAWINGS

FIG. 3A1 and FIG. 3A2 are cross sectional views along with a line B—B in FIG. 2A, and FIG. 3B1 and FIG. 3B2 are cross sectional views along with a line C—C in FIG. 2A.

FIG. 4A is a plan view showing the probe unit according to the embodiment of the present invention, and FIG. 4B is a cross sectional view along with a line B—B in FIG. 4A.

DETAILED DESCRIPTION OF THE PREFERRED EMBODIMENTS

Figure 1A:
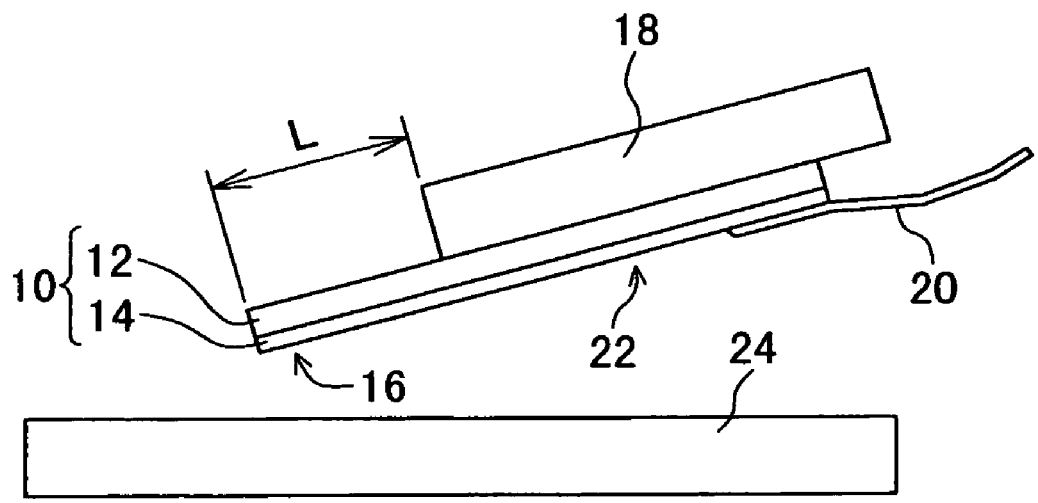
FIG. 1A and FIG. 1B are side views showing probe units according to a first example of a first embodiment of the present invention

FIG. 1 and FIG. 2 show a structure of a probe unit according to a first example of a first embodiment of the present invention. A probe unit 10 is used for inspecting an electrical feature of, for example, a liquid crystal panel (a sample) by contacting with an electrode 24 of the sample, and equips with a flexible substrate 12 and electro conductive films 14 formed on a surface of the flexible substrate 14. In the probe unit 10 according to the first example, tip parts (contact parts) of the electro conductive film 14 contacting with electrodes of a sample are formed on a straight edge of the substrate 12, and the contact parts 16 are not projecting from the edge of the substrate 12, i.e., the contact parts 16 are aligned on the edge. Further, this edge may be almost straight including arc-shaped or the likes.

The substrate 12 is made of an inorganic substance such as ceramics, glass ceramics, glass, silicon, metal, etc. As ceramics, for example, alumina, mullite, aluminum nitride, silicon nitride, zirconia-toughened alumina, MACOR ($SiO_2$, MgO, $Al_2O_3$, $K_2O$) or something like that is preferred, especially, as shown in Table 1, zirconia is preferred because of its higher mechanical strength.

TABLE 1

| | Zirconia $ZrO_2$ | Alumina $Al_2O_3$ | Mullite $3Al_2O_3$—$2SiO_2$ | Aluminum nitride AlN | Silicon nitride $Si_3N_4$ | Toughened alumina $Al_2O_3$—$ZrO_2$ | Glass ceramics |
|---|---|---|---|---|---|---|---|
| Bending strength (MPa) | 1120 | 350 | 280 | 300 | 880 | 680 | 230 |
| Young's modulus (GPa) | 210 | 380 | 210 | 320 | 290 | 289 | 110 |
| Coefficient of thermal expansion ($\times 10^{-6}/°C.$) | 10.5 | 7.2 | 5 | 4 | 3.2 | N/A | 5 |
| Max deformation ($\delta$ max) | 100 | 17 | 25 | 18 | 57 | 44 | 39 |

When inorganic material such as silicon, metal, etc. other than ceramics is used for the substrate 12, an insulating film 30 is formed between the substrate 12 and the electro conductive film 14 as shown in FIGS. 3A1 and 3B1. Resin, alumina, silica or the like may be used as the insulating film 30. Further, as shown in FIGS. 3A2 and 3B2, the insulating film 30 may filled up a gap between each contact part 16 of the insulating films 14.

It is preferable that a thickness of the substrate 12 is in a range from 10 μm to 500 μm. Table 2 shows results of examinations of relationships between thickness T of the substrate 12 and a distance OD of over drive in the probe unit 10 according to the first example shown in FIG. 1. The substrate made of zirconia with length of 12 mm, width of 28.54 mm is used. According to the examination results, when the substrate is made of zirconia has thickness of 10 μm, 0.139 mm overdrive can be applied as a safety factor 1. At this time, load W added on the electrode is 5.6 gf from a following equation 1 that defines a pitch B of the contact parts 16 as 60 μm.

$$W = (E \times B \times T^3 / 4 \times L^3) \times OD \quad \text{Equation 1}$$

TABLE 2

| L [mm] | T [mm] | E [kgf/mm²] | σy [kgf/mm²] | Odmax[mm] f = 1 | f = 5 | f = 10 |
|---|---|---|---|---|---|---|
| 2.000 | 0.075 | 21414 | 112 | 0.186 | 0.037 | 0.019 |
| 2.000 | 0.100 | 21414 | 112 | 0.139 | 0.028 | 0.014 |
| 2.000 | 0.125 | 21414 | 112 | 0.112 | 0.022 | 0.011 | where "L" is an amount of a contact part projection,
"T" is a thickness of the substrate,
"E" is a perpendicular modulus of elasticity,
"σy" is bending strength, and
"f" is a safety factor.

Table 3 shows results of examinations of relationships between thickness T of the substrate 12 and load W in the probe unit 10 according to the first example shown in FIG. 1. Conditions not shown in Table 3 is same as described in the Table 2. Clearly from the examination results, when thickness T of the substrate 12 exceeds 500 μm, the load added on the electrode of the sample will be 100 gf or more at 0.02 mm overdrive and it is possible to damage the electrode 24 of the sample. Therefore, a preferable thickness of the substrate 12 is 500 μm or less.

TABLE 3

| L [mm] | B [μm] | E [kgf/mm²] | T [mm] | OD [mm] | W [gf] |
|---|---|---|---|---|---|
| 2 | 50 | 21414 | 0.1 | 0.02 | 0.669 |
| 2 | 50 | 21414 | 0.1 | 0.05 | 1.673 |
| 2 | 50 | 21414 | 0.1 | 0.1 | 3.346 |
| 2 | 50 | 21414 | 0.2 | 0.02 | 5.354 |
| 2 | 50 | 21414 | 0.2 | 0.05 | 13.384 |
| 2 | 50 | 21414 | 0.2 | 0.1 | 26.768 |
| 2 | 50 | 21414 | 0.3 | 0.02 | 18.068 |
| 2 | 50 | 21414 | 0.3 | 0.05 | 45.170 |
| 2 | 50 | 21414 | 0.3 | 0.1 | 90.340 |
| 2 | 50 | 21414 | 0.4 | 0.02 | 42.828 |
| 2 | 50 | 21414 | 0.4 | 0.05 | 107.070 |
| 2 | 50 | 21414 | 0.4 | 0.1 | 214.140 |
| 2 | 50 | 21414 | 0.5 | 0.02 | 83.648 |
| 2 | 50 | 21414 | 0.5 | 0.05 | 209.121 |
| 2 | 50 | 21414 | 0.5 | 0.1 | 418.242 |
| 2 | 50 | 21414 | 0.6 | 0.02 | 144.545 |
| 2 | 50 | 21414 | 0.6 | 0.05 | 361.361 |
| 2 | 50 | 21414 | 0.6 | 0.1 | 722.723 |

As shown in FIG. 2, the electro conductive film 14 is formed on the surface of the substrate 12. Nickel, Ni—Fe alloy, Ni—Co alloy or the like is preferable as a material of the electro conductive film. A preferred thickness of the electro conductive film 14 is from 0.5 μm to 300 μm.

The tip parts 16 of the electro conductive film 14 are aligned on the surface of the edge of the substrate 12 and consist contact parts contacting with electrodes of a sample. By covering a surface of each contact part 16 with a metal film that has lower resistivity than gold, gold-copper alloy, palladium, platinum, iridium, ruthenium, nickel such as rhodium, nickel-iron alloy, etc., an electrical resistance of the probe unit 10 can be decreased. In addition, by covering the surface of each contact part 16 with a metal film that has higher hardness than iridium, ruthenium, nickel such as rhodium, nickel-iron alloy, etc., friction of the contact parts 16 can be controlled. Thickness of these metal films is, for example, 0.01 μm to 20 μm. Further, it is not always necessary to cover the contact parts 16 with the metal films that are different from the base material. Table 4 shows characteristics of these metals.

TABLE 4

| | Resistivity | Knoop hardness |
|---|---|---|
| Ni | 6.2 | 400 |
| NiFe(Ni81%) | 18 | 500 |
| Au | 2.1 | 120 |
| AuCu(Au99%) | 3 | 240 |
| Pd | 10.4 | 400 |
| Pt | 10.6 | 400 |
| Ir | 6.5 | 750 |
| Ru | 7.5 | 800 |
| Rh | 5.1 | 900 |

The contact parts 16 are aligned on the surface of the edge of the substrate 12 corresponding to a pitch of the electrodes of the sample. Tips of the contact parts 16 are aligned on an edge side 26 of the substrate 12. Each of lead parts 22 (refer to FIG. 1) is extended from each of the contact parts 16 along the same surface where the contact parts 16 of the substrate 12 are formed. By forming the contact parts 16 and the lead parts 22 on the same surface of the substrate 12, the lead parts 22 become hard to be peeled off from the substrate 12 when the substrate 12 is bent by pressing the surfaces of the contact parts 16.

Since the adjacent contact parts 16 are connected with each other by the edge of the substrate 12, each contact part does not deform independently. That is, even if load is added on one of the contact parts 16 from the contacted electrode, every contact part 16 elastically deforms with the substrate 12 in a condition that all the contact parts 16 are collectively supported by the edge of the substrate 12; therefore, a pitch of each contact part 16 will not be changed. Therefore, since it is prevented that the contact part 16 is dropped out from the electrode of the sample, contact pressure between the contact part and the electrode can be increased, and the contact part and the electrode can be electrically connected certainly.

Figure 2A:
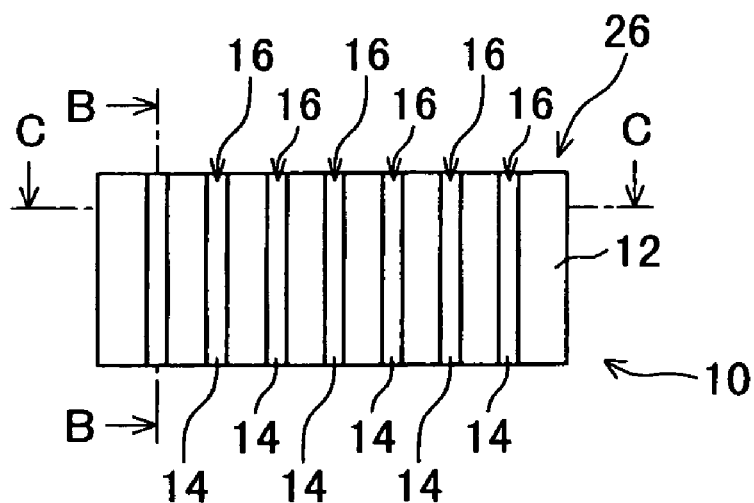
FIG. 2A is a plan view showing the probe unit according to the first embodiment of the present invention.
Figure 2B:
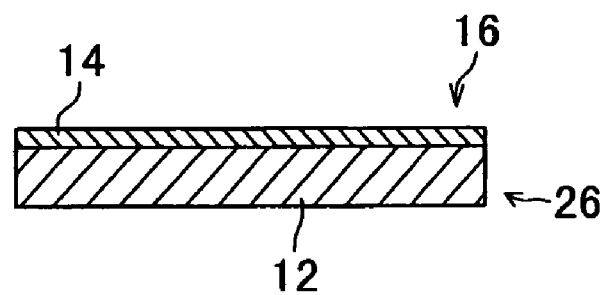
FIG. 2B is a cross sectional view along with a line B—B in FIG. 2A.
Figure 2C:
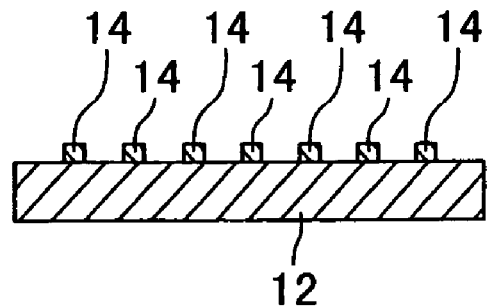
FIG. 2C is a cross sectional view along with a line C—C in FIG. 2A.
Figure 2D:
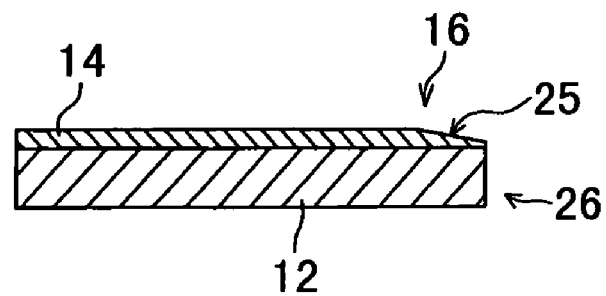
FIG. 2D is a cross sectional view showing a probe unit according to a modification of the first embodiment of the present invention.

Moreover, One ends (the tips) of the contact parts 16 may be thinner than other ends as shown in FIG. 2D. By forming the contact parts 16 on the slope 25 to be almost parallel to surfaces of electrodes of a sample when the electrodes are pressure-welded with the contact parts 16, contacting areas of the contact parts 16 and the electrodes can be increased.

Furthermore, as shown in FIGS. 4A and 4B, a drain 28 may be formed back surface (another surface of the surface where the electro conductive film is formed) of the substrate 12. By forming, on the substrate 12, the groove 28 extending to a direction crossing an orientation of the contact part 16 at right angles, a bending shape of the substrate 12 at a time of overdrive can be controlled.

Figure 5A:
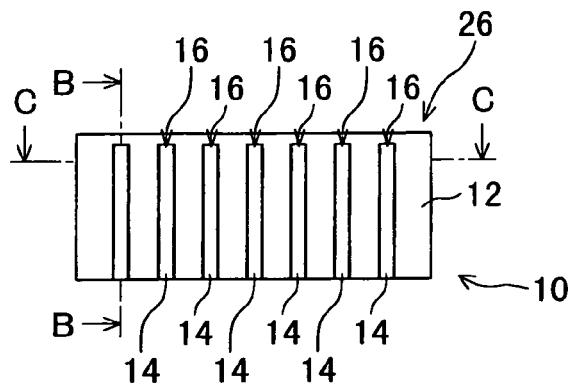
FIG. 5A is a plan view showing probe unit according to a second example of the first embodiment of the present invention.
Figure 5B:
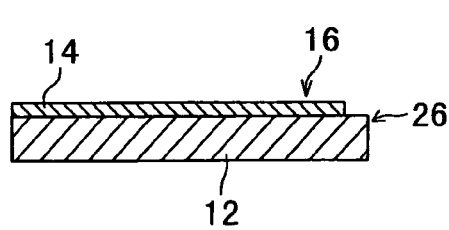
FIG. 5B is a cross sectional view along with a line B—B in FIG. 5A.
Figure 5C:
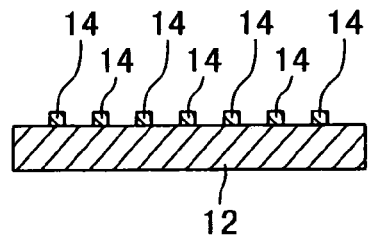
FIG. 5C is a cross sectional view along with a line C—C in FIG. 5A.

FIGS. 5A to 5C show the probe unit according to a second example of the first embodiment of the present invention. In the probe unit according to the second example, the contact parts 16 of the electro conductive films 14 contacting with the electrodes of the sample are formed at the straight edge of the substrate 12, and the contact parts 16 are not projecting from the edge of the substrate 12. Tips of the contact parts 16 are stood back inside from the edge 26 of the substrate 12.

Even if load is added on the contact parts 16 from the electrode of the sample, as same as the first example, each contact part 16 elastically deforms with the substrate 12 in a state of being collectively supported by the edge of the substrate 12, a pitch between the contact parts 16 is not changed.

Figure 6A:
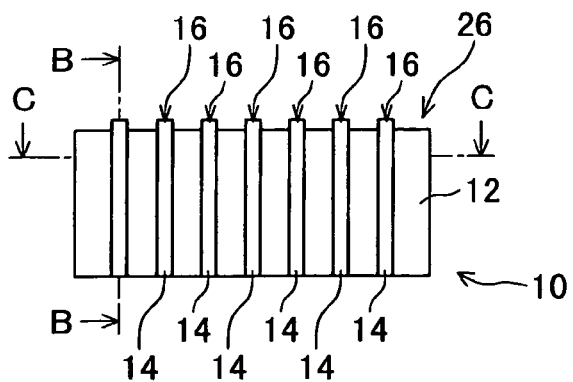
FIG. 6A is a plan view showing a probe unit according to a third example of the first embodiment of the present invention.
Figure 6B:
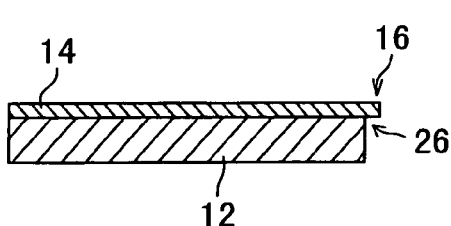
FIG. 6B is a cross sectional view along with a line B—B in FIG. 6A.
Figure 6C:
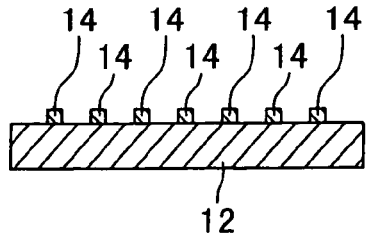
FIG. 6C is a cross sectional view along with a line C—C in FIG. 6A.

FIGS. 6A to 6C show the probe unit according to a third example of the first embodiment of the present invention. In the probe unit according to the third example, the contact parts 16 of the electro conductive films 14 contacting with the electrode of the sample are formed at the straight edge of the substrate 12, and the contact parts 16 are projecting a little bit from the edge of the substrate 12. Even if the contact parts 16 are projecting from the edge of the substrate 12, in a case that projecting length is short, contact pressure between the contact parts 16 and the electrodes of the sample can be increased by using elasticity of the substrate 12.

Next, a manufacturing method of the probe unit according to the first embodiment will be explained. In the following explanation, the manufacturing method of the probe unit that is a probe unit projecting the contact part of the electro conductive film from the edge of the substrate according to the third example of the first embodiment of the present invention is mainly explained.

Figure 7A:
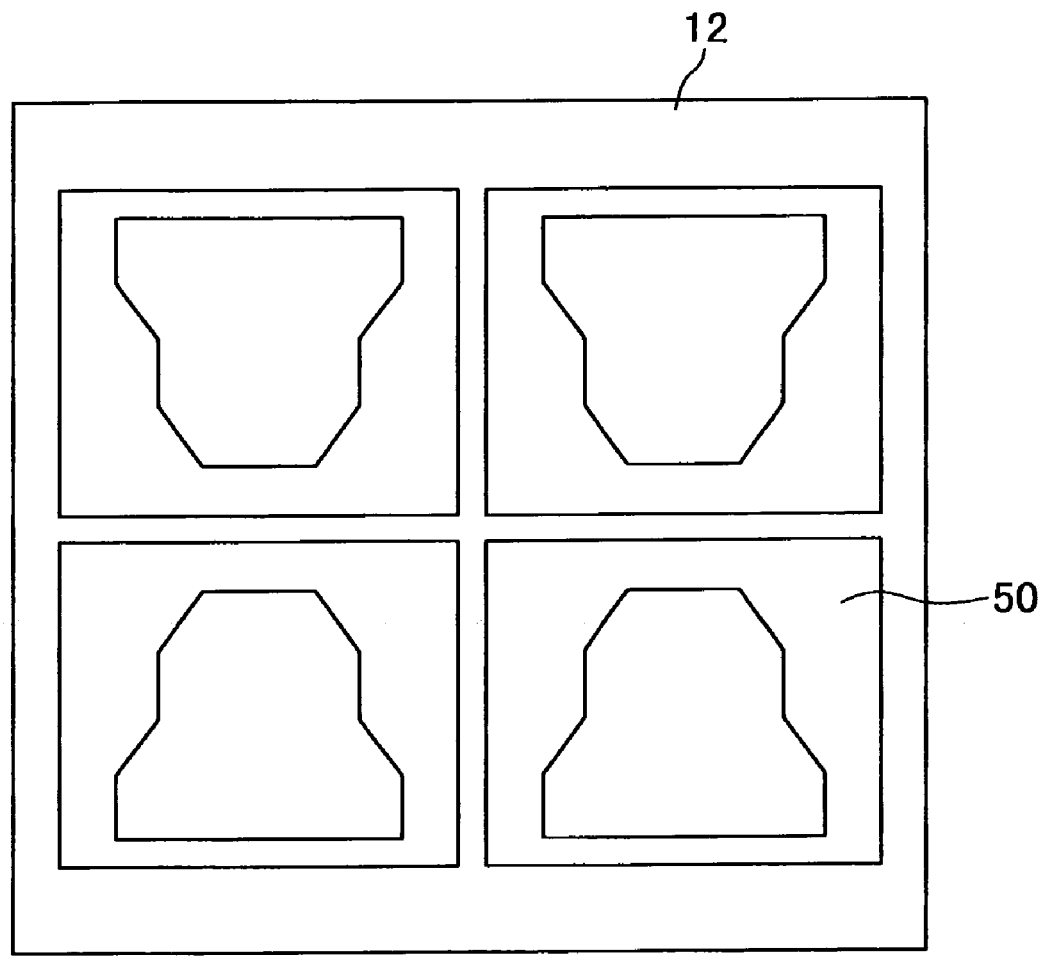
FIG. 7A is a plan view showing a manufacturing method of the probe unit according to the first embodiment of the present invention.
Figure 7B:
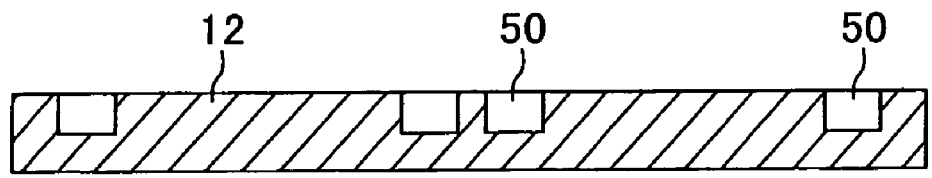
FIG. 7B is its cross sectional view.

As shown in FIG. 7A and FIG. 7B, concave parts 50 for forming four outlines of finished products on the substrate 12 are formed on the surface of the substrate 12. Depth of each concave part 50 is deeper than the thickness of the finished products of the substrates 12. Further, the concave parts 50 may be formed at least in positions where the electro conductive films projects from the finished substrates 12. When a conductive substrate such as a metal plate and the like is used, the substrate 12 having an insulating layer formed on the surface where the concave parts 50 are formed is used. As a processing method of the concave parts 50, a machining process, a grinding process, a chemical etching process, a dry etching process, a sand blasting process, a horning process, a laser process or the likes can be used. When a ceramics plate is used for making the substrate 12, the concave parts 50 may be formed before burning the substrate 12. When a metal plate is used for making the substrate 12, a mold for making the substrate having the concave parts 50 may be made in advance, and the concave parts 50 may be formed by casting the metal plate with the mold. When a silicon plate is used for making the substrate 12, the concave parts 50 may be formed by the anisotropic etching.

Figure 8A:
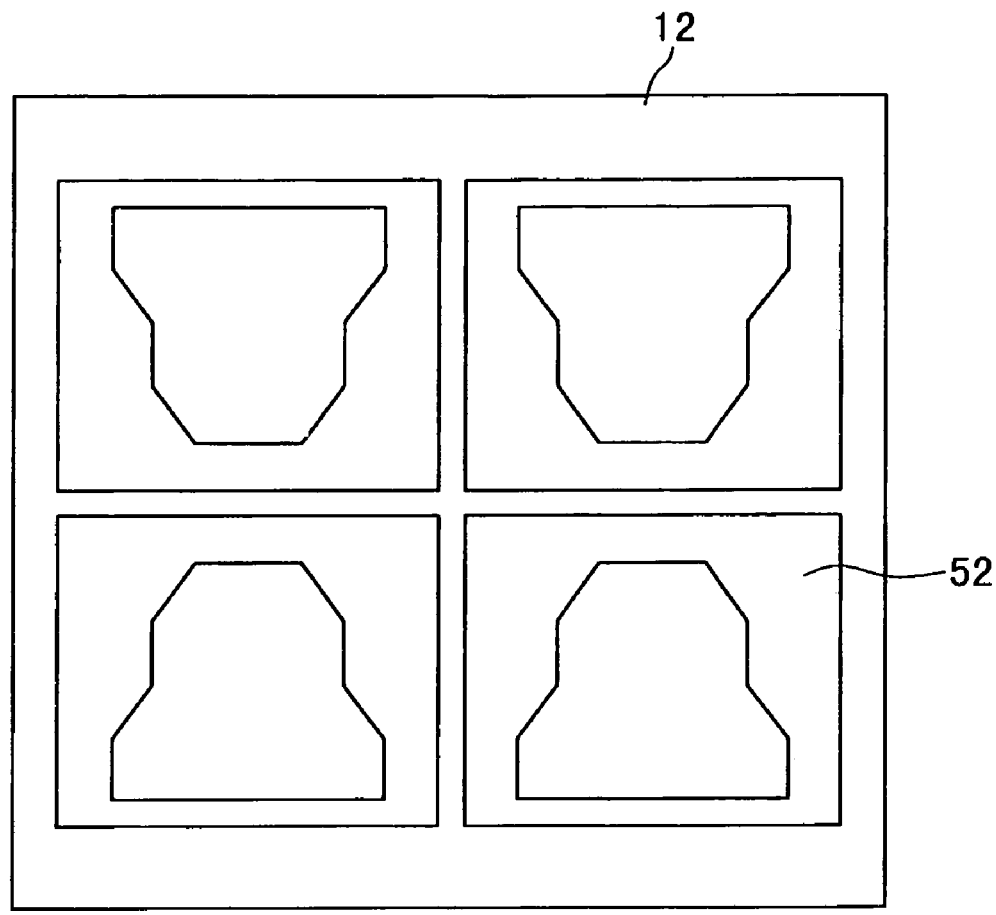
FIG. 8A is a plan view showing a manufacturing method of the probe unit according to the first embodiment of the present invention.
Figure 8B:
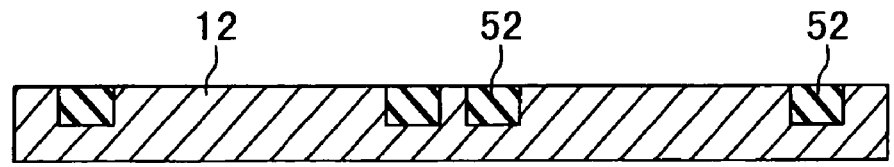
FIG. 8B is a its cross sectional view.

Next, sacrificial films 52 are formed with a thickness that is more than the depth of the concave parts 50 in the concave parts 50, and thereafter, surfaces of the sacrificial films 52 are removed by polishing, etc. so that the substrate 12 including the sacrificial films 52 is planarized and the sacrificial films 52 are remained only in the concave parts 50 as shown in FIG. 8A and FIG. 8B. Although the thickness of the sacrificial films 52 before thinning the surface changes depending on the thickness of the substrate 12 and the depth of the concave part 50, about 0.05 mm to 0.4 mm is preferable. For making the sacrificial films 52, for example, a metal such as Cu, an epoxy resin, an urethane resin or inorganic salts such as calcium carbonate or the like can be used. When the epoxy resin or the urethane resin is used for making the sacrificial films 52, the sacrificial films 52 can be selectively removed by the following process using a glass plate, a ceramics plate, a metal plate or the like to the substrate 12.

Concretely, when the metal is used for the sacrificial film 52, whole surface of the substrate 12 on which concave part 50 was formed is metal-plated, and the plated surface is polished until the substrate 12 is exposed. Then the substrate is planarized with the metal remaining only in the concave parts 50, and the sacrificial films 52 are formed. When the substrate 12 is conductive, the surface of the plated metal is polished until the insulating layer of the substrate 12 is exposed.

When the metal is used for making the sacrificial films 52 and the corners of the concave parts 50 is in a squared-shape, a hollow may be formed in the process of plating. Therefore, it is preferable that the corners of the concave parts 50 are in a rounded-shape. When the epoxy resin or the urethane resin is used for making the sacrificial films 52, the shape of the corners of the concave parts are not limited, and they may be in a squared-shape.

When the inorganic salt is used for making the sacrificial films 52, powder of the inorganic salt is filled in the concave parts 50 and pressed in order not to make a cave or a hollow, and thereafter the surface is polished to planarize so that the sacrificial films 52 are formed only inside the concave parts 50.

In this process, since the concave parts 50 that are not pierced halls are filled up with the sacrificial films 52, it is not necessary that a baseboard is connected to the substrate 12, and the substrate 12 itself works as a reinforcement part, and flatness of the surface of the sacrificial films 52 can be improved. Further, since a baseboard flaking process becomes unnecessary, problems such as the probe that is formed later is damaged by physical force at a time of baseboard flaking will not be happened.

Figure 9A:
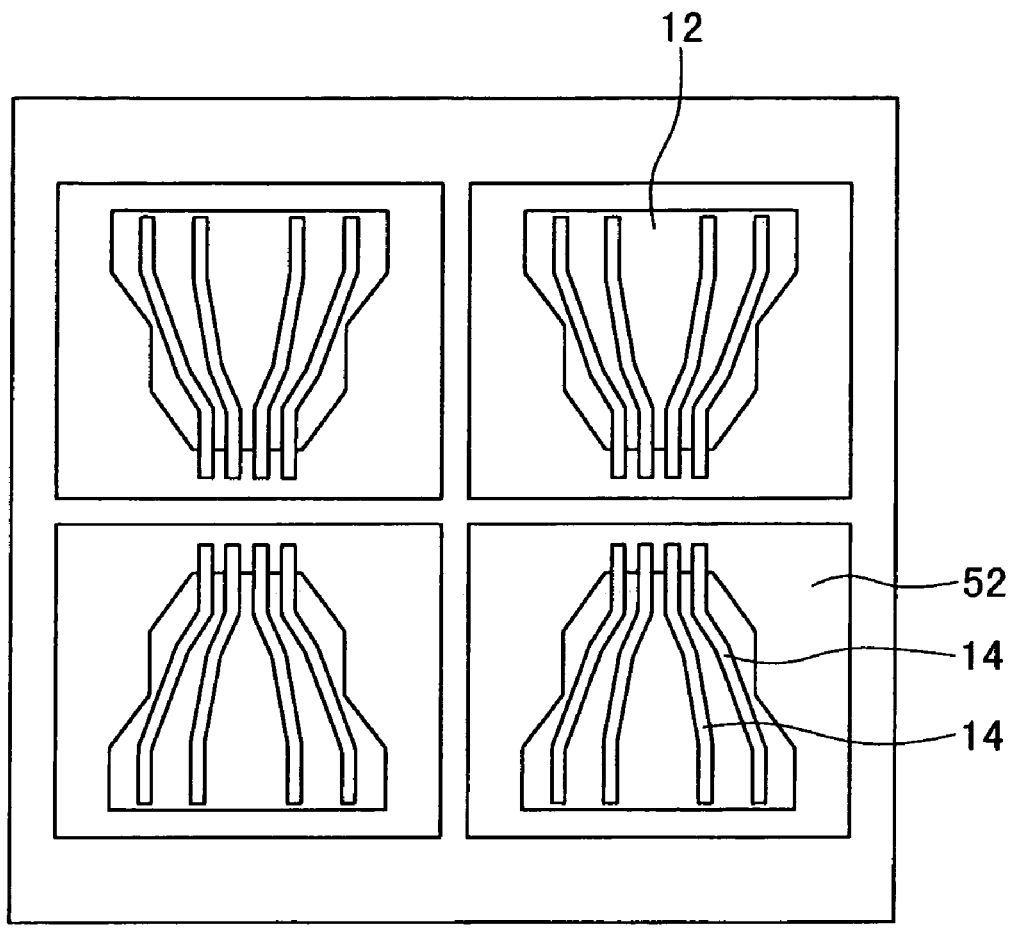
FIG. 9A is a plan view showing a manufacturing method of the probe unit according to the first embodiment of the present invention.
Figure 9B:
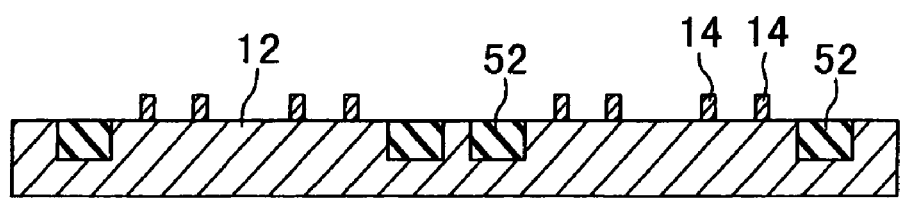
FIG. 9B is a its cross sectional view.

Next, as shown in FIG. 9A and FIG. 9B, the electro conductive films 14 of which tips are extended to the sacrificial films 52 are formed. In this process, since the flat surfaces of the sacrificial films 52 are formed in the previous process, the electro conductive films 14 can be aligned in parallel on the sacrificial film by a small pitch. Detailed forming method of the electro conductive films 14 is, for example, first, a plating base layer is formed on the whole surface of the substrate 12 including on the surfaces of the sacrificial films 52. Next, only certain parts of the plating base layer where the electro conductive films will be formed are exposed, and remaining part is coated with a resist layer to carry out a metal plating process on the surface of the exposed plating base layer. At last, plating base layer other than the electro conductive film and the resist are removed. By using patterning by photo etching and well-known patterning such as printing of conductive paste on the substrate, metal plating may be carried out after forming a plating base layer to a pattern of the electro conductive films 14.

Figure 10A:
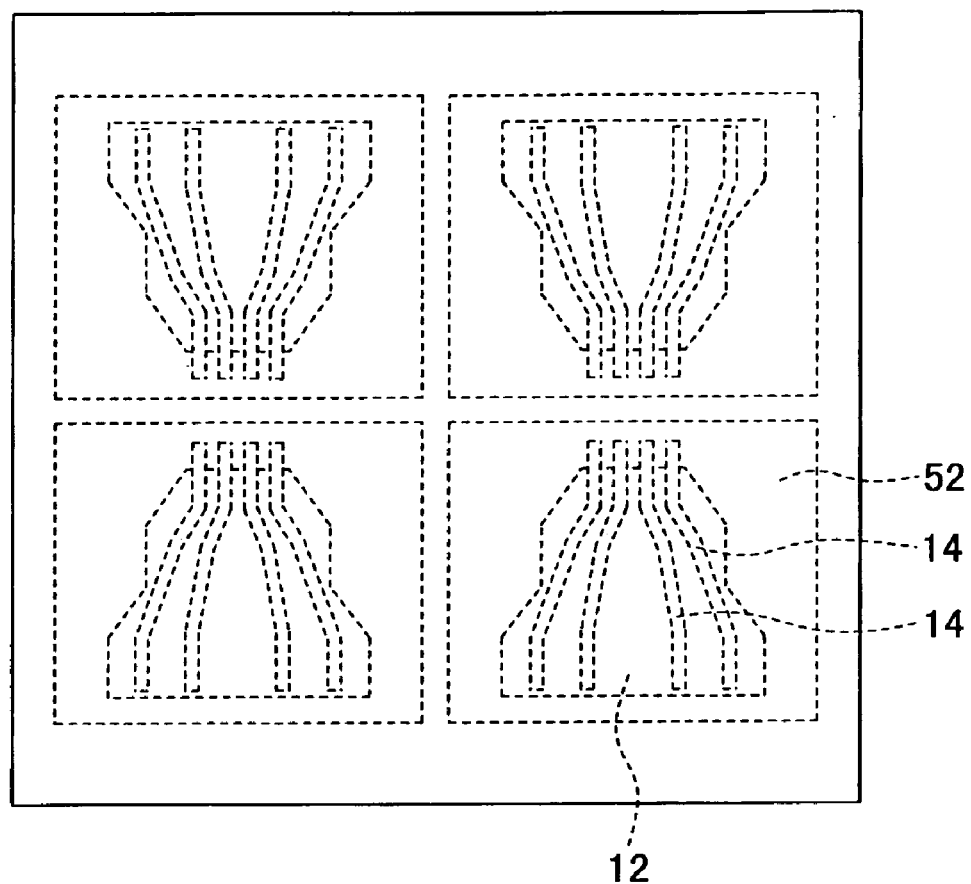
FIG. 10A is a plan view showing a manufacturing method of the probe unit according to the first embodiment of the present invention.
Figure 10B:
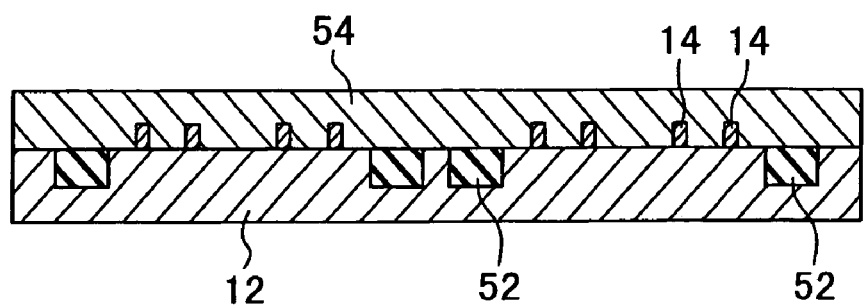
FIG. 10B is its cross sectional view.

Next, as shown in FIG. 10A and FIG. 10B, a protection film 54 is formed on the whole surface of the substrate 12 on which the electro conductive films 14 is formed. For making this protection film 54, material which protects the electro conductive film 14 at a time of thinning back of the substrate 12 and gives no damage to the electro conductive film 14 at a time of being removed from the electro conductive film 14 is used, for example, the epoxy resin, the urethane resin, the metal, the glass or the like may be used. In order to simplify the process, it is preferable to use the same material used for making the sacrificial films 52 as for making the protection film 54. As described above, the protection film 54 may not be formed even if it is formed to protect the conductive layer 14.

Figure 11A:
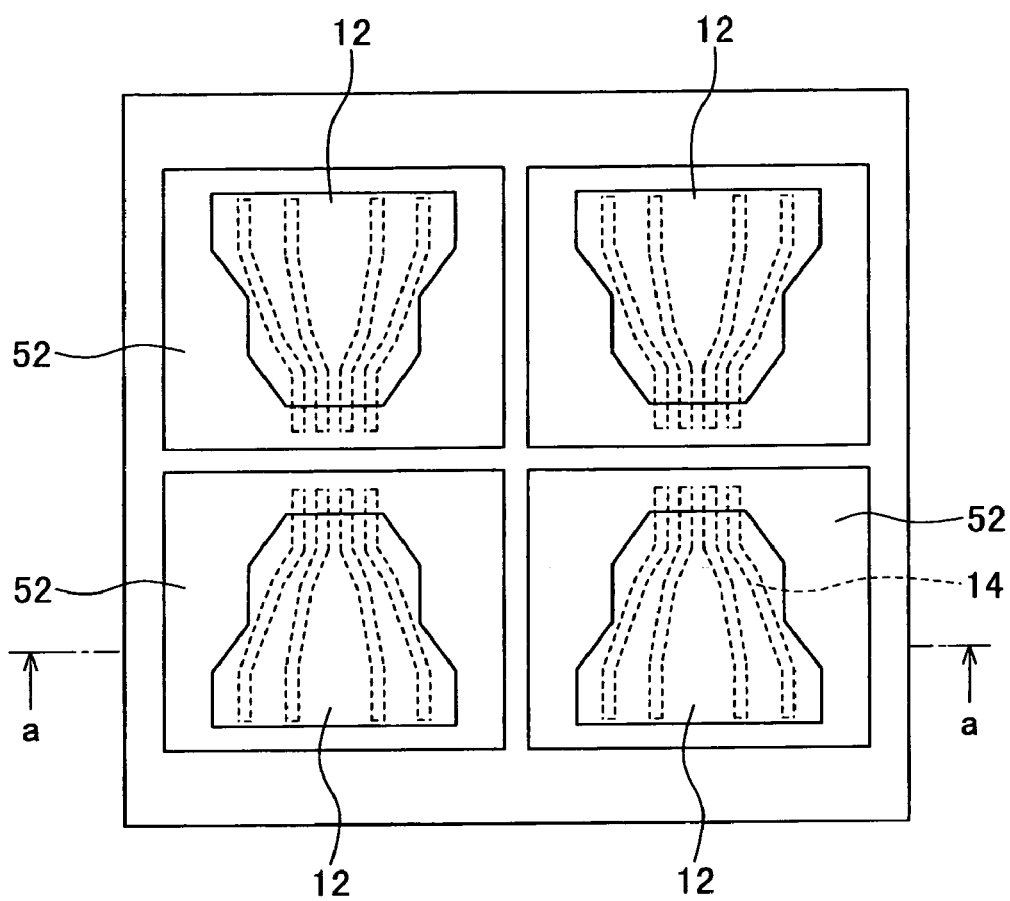
FIG. 11A is a plan view showing a manufacturing method of the probe unit according to the first embodiment of the present invention.
Figure 11B:
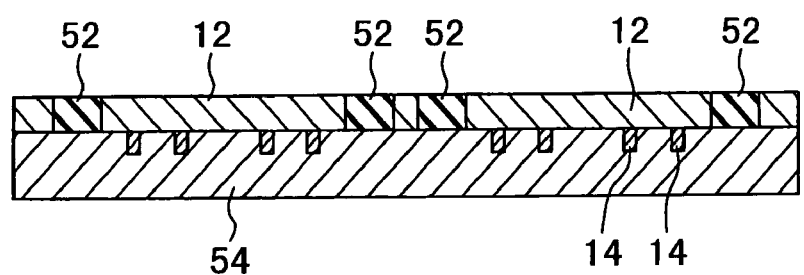
FIG. 11B is a its cross sectional view.

Next, as shown in FIG. 11A and FIG. 11B, the substrate 12 is thinned by polishing from the back of the substrate 12, and they are processed to have a predetermined thickness until the sacrificial films 52 are exposed on the back of the substrate 12. By this process, pierced parts filled up with the sacrificial films 52 are formed on the substrate 12. The substrate 12 is divided into parts corresponding to the four finished products and other unnecessary parts by the pierced parts. The parts corresponding to the finished products and unnecessary parts are connected by the sacrificial films 52 and/or the protection films 54, and they are in a condition of not being separated. Further, for the thinning process of the substrate 12, for example, a sand blasting process, a machining process, a grinding process, a chemical etching process, a dry etching process, a honing process, a laser process or the like can be used.

Figure 12A:
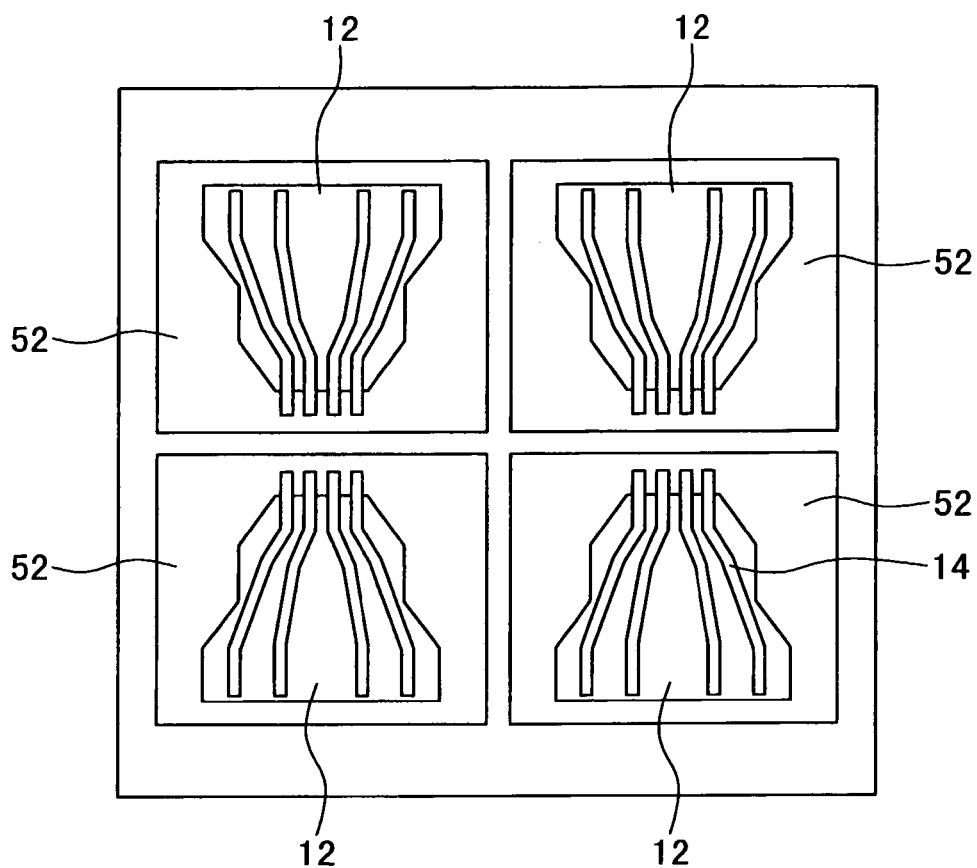
FIG. 12A is a plan view showing a manufacturing method of the probe unit according to the first embodiment of the present invention.
Figure 12B:
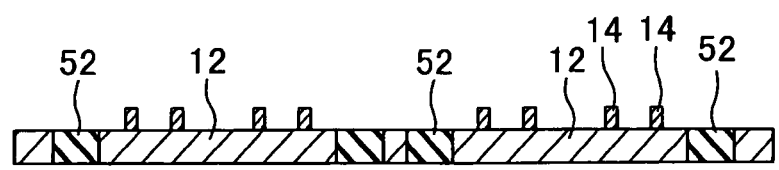
FIG. 12B is its cross sectional view.

Next, as shown in FIG. 12A and FIG. 12B, the protection film 54 is removed. When the protection film 54 is made of a metal, it is removed by etching. When the protection film 54 is made of a resin, it is removed by dissolution with warmed N-Methylpyrrolidone, ashing, dry etching or the like. When the protection film 54 is made of an inorganic substance such as calcium carbonate, it is removed by dissolution by nitric acid.

Figure 13A:
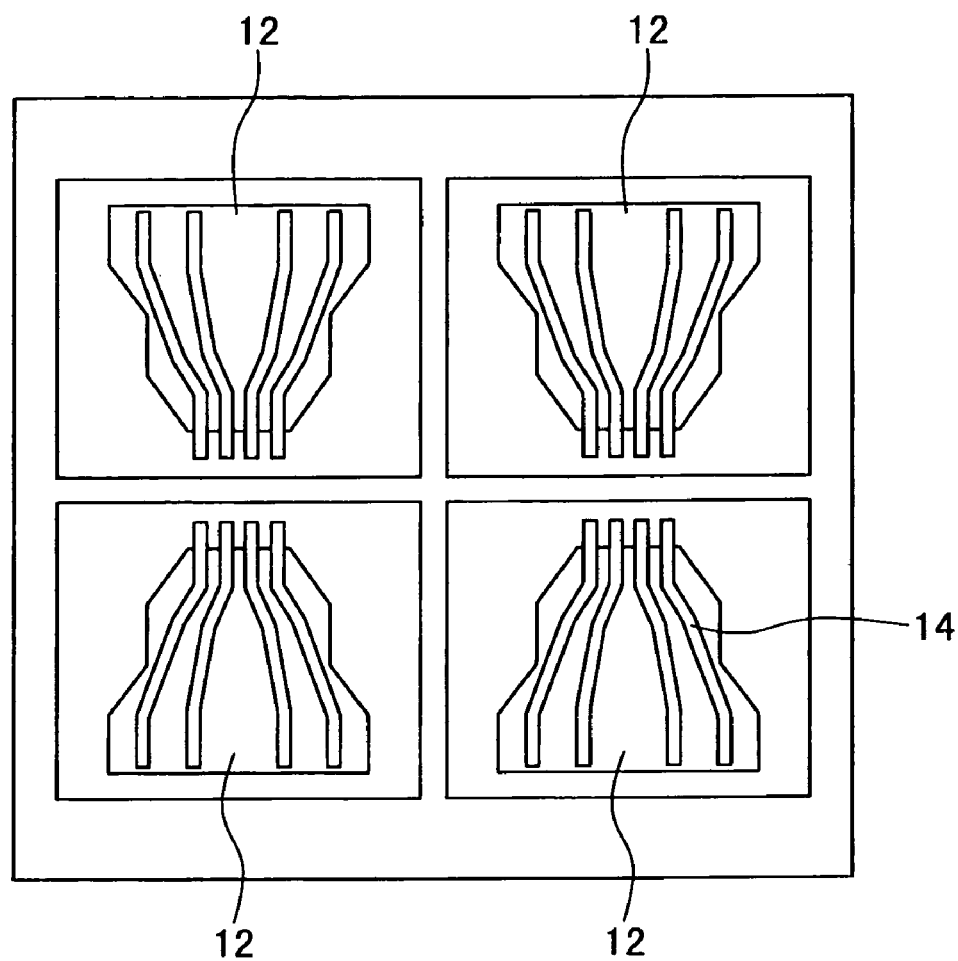
FIG. 13A is a plan view showing a manufacturing method of the probe unit according to the first embodiment of the present invention.
Figure 13B:
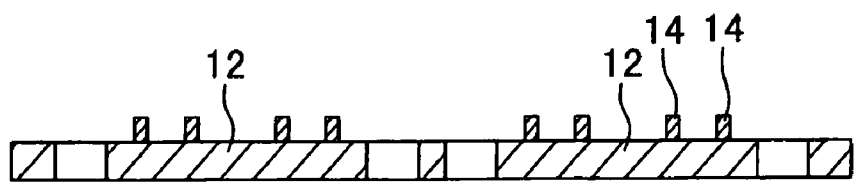
FIG. 13B is its cross sectional view.

Next, as shown in FIGS. 13A and 13B, the sacrificial films 52 are removed, and the substrates 12 corresponding to 4 finished products are removed from the unnecessary parts. Detailed removal method is similar to the above-described removal method of the protection film 54. Further, Although the protection film 54 is removed ahead of a sacrificial film 52 in the above-described processes, the sacrificial films 52 may be removed ahead of the protection film 54.

The probe unit according to the first embodiment of the present invention may be manufactured in the following manner. In this case, the electro conductive films are formed on the substrate in the finished outline fixed to a baseboard.

Figure 14A:
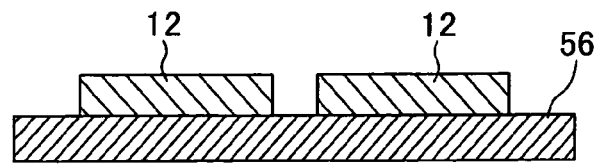
FIG. 14A to FIG. 14D are cross sectional views showing a manufacturing method of the probe unit according to the first embodiment of the present invention.

First, as shown in FIG. 14A, the substrates 12 of which finished outlines are formed are fixed on the baseboard 56. Suitable material for the substrates 12 can be used for the baseboard 56. However, material of the baseboard 56 and the substrates 12 are not necessarily the same. The baseboard 56 and the substrates 12 are connected by an adhesive, a low-melting glass contact, static contact process, a supersonic contact process, or a flitting contact process in an inert gas atmosphere. Also, by growing a metal layer on the back of the substrate 12 by plating, the metal layer that is grown by plating may be used as the baseboard 56.

Figure 14B:
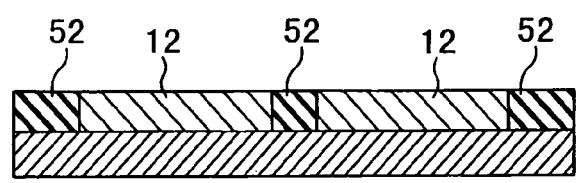

Next, as shown in FIG. 14B, the sacrificial film 52 is formed in a space between each substrate in the manner similar to the above-described process of forming the sacrificial films 52.

Figure 14C:
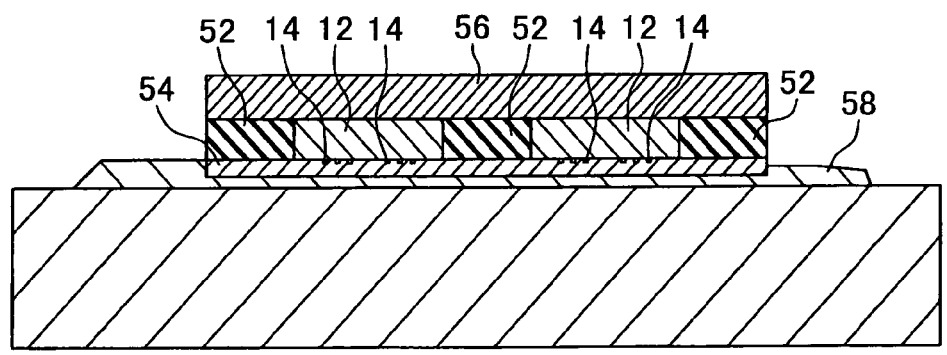

As shown in FIG. 14C, a work is set on a table 58 after covering the electro conductive films 14 with the protection film 54. The protection film 54 may be formed in the manner similar to the above-described process of forming the protection film 54.

Figure 14D:
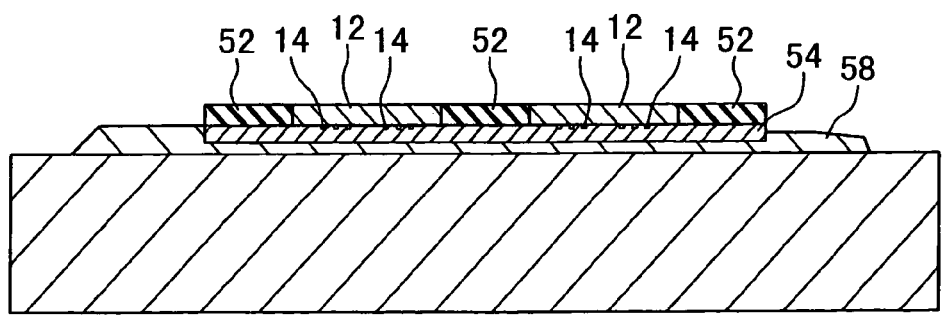

As shown in FIG. 14D, the baseboard 56 is removed by polishing from the back of the baseboard 56 to be exposed the back of the substrates 12, and the substrates 12 are thinned until the substrates 12 have a predetermined thickness. When the baseboard 56 can be removed by etching, the substrates 12 may be thinned by polishing until they have a predetermined thickness after removing the baseboard 56 by etching.

The probe unit, wherein contact parts of a electro conductive films are not projected from an edge of a substrate, according to the first example of the first embodiment of the present invention can be manufactured by the above-described method of manufacturing the second example with a miner modification. Also, the probe unit (refer to FIG. 5) arranging the tip of the electro conductive film 14 stood back inside from the edge of the substrate 12 can be manufactured by the above-described method of manufacturing the second example with a miner modification.

In the above-described process (refer to FIG. 9) of forming the electro conductive films, shapes of the electro conductive films and projecting amount of the conduction films 14 from the substrates 12 can be adjusted by adjusting a region coated by the resist, a patterned-shape of a photo-etching or printing region of a conductive paste. Therefore, a probe unit (refer to FIG. 2 etc.) with the tips of the electro conductive films 14 not projecting from the substrate 12 and the probe unit (refer to FIG. 5) arranging the tip of the electro conductive film 14 stood back inside from the edge of the substrate 12 can be formed.

Further, after forming the electro conductive films with the tips of the electro conductive films projecting from the edge of the substrate, the parts projected from the substrate of the electro conductive films may be thinned by a sand blasting process, a honing process, a dry etching process, a chemical etching or the like to manufacture the probe unit according to the first example.

The probe unit according to the first example of the first embodiment of the present invention may be manufactured without making the concave parts and the sacrificial films explained in the above-described manufacturing method. In this case, the probe unit having the electro conductive films of which the tips are not projecting from the edge of the substrate can be manufactured in the following manner.

Figure 15A:
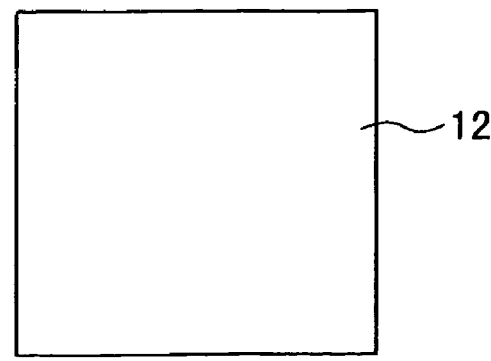
FIG. 15A to FIG. 15D are plan views showing a manufacturing method of the probe unit according to the first embodiment of the present invention.
Figure 15B:
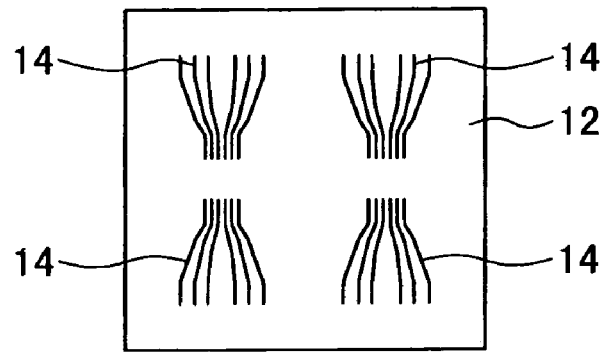

First, as shown in FIG. 15A and FIG. 15B, the electro conductive films 14 are formed on a flat surface of a substrate 12 in the same manner as in the above-described process of forming the electro conductive films 14 without forming sacrificial films.

Figure 15C:
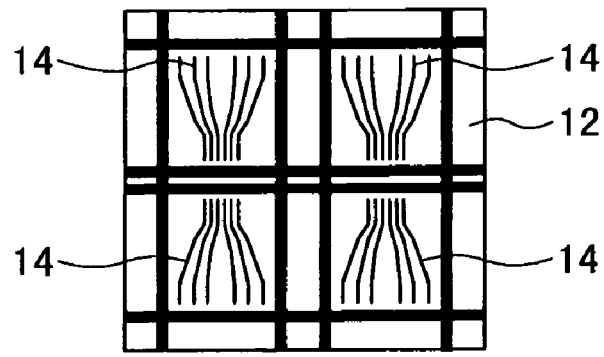
Figure 15D:
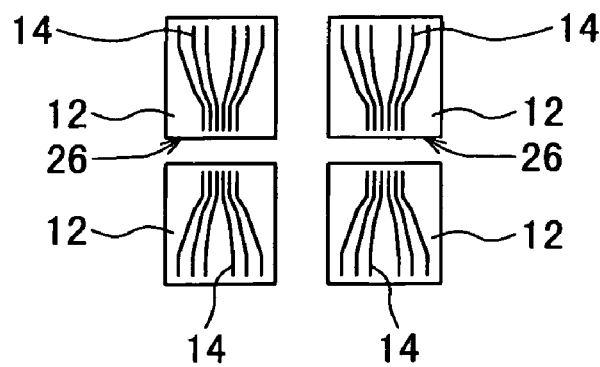

Next, as shown in FIG. 15C and FIG. 15D, the outline shapes of the substrate 12 can be formed by a machining process such as cutting. At this time, because the electro conductive films 14 projecting from the outline of the substrate 12 as a finished product is cut out together with the substrate 12, the tips of the electro conductive film 14 are lined up on the edge of the substrate 12.

Further, for the process of forming the outlines of the substrates 12 as finished products, for example, a chemical etching process, a dry etching process, a sand blasting process, a honing process, a laser process, a cleaving process or a combination of those can be used other than the cutting process.

Moreover, although the sequential order of the thinning process of the substrates 12 and the forming process of the finished outline of the substrates 12 may be interchangeable, it makes easier to form the finished outlines of the substrates 12 when the thinning process of the substrates 12 is performed before the forming process of the finished outline of the substrate 12.

Figure 1B:
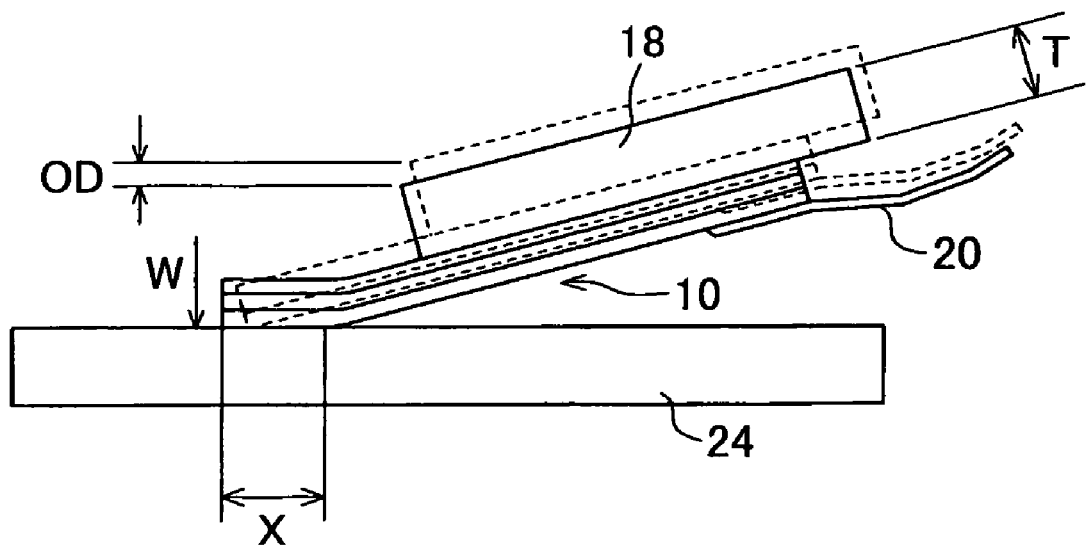

Next, a usage of the probe unit according to the embodiment of the present invention will be explained with reference to FIGS. 1A, 1B, 16A, 16B, 17A and 17B. As shown in FIGS. 1A and 17A, the probe unit 10 is fixed on a fixture 18 so that the edge of the substrate 12 where the contact parts 16 of the electro conductive films 14 are positioned projects from the edge of the fixture 18. By that, as shown in FIG. 1B and FIG. 17B, the edge of the substrate 12 where the contact parts 16 are aligned becomes to be able to be elastically deformed. Because the substrate 12 is elastically deformed, each contact part 16 can follow a wave of the electrodes 24 of the sample or a bump on the surface of the electrodes 24.

In the probe unit 10 according to the embodiment of the present invention, since the substrate 12 consisted of the inorganic substance elastically deforms together with the contact parts 16 that is supported by the substrate 12, contact pressure between the electrodes 24 and the contact parts 16 can be increased. Therefore, if there is an insulating oxide film or something stacked on the surface of the contact parts 16, it will be possible to improve reliability of an electrical contact between the electrodes 24 and the contact parts 16.

Also, a heavy load can be impressed on the contact parts 16 and the substrate 12 because the contact parts 16 are supported by the substrate 12, the electro conductive films 14 and the electrodes 24 of the sample can be connected in a wide area by overdrive as shown in FIG. 12A. By connecting the electro conductive films 14 and the electrodes 24 of the sample in a wide area, the electrodes 24 and the electro conductive films 14 can surely turned on even if there is a defect 15 or a contamination 17 on the surfaces of the electrodes 24. It is preferable that the length X to contact the electrode 24 with the electro conductive film 14 will be 3 μm or more.

Figure 16A:
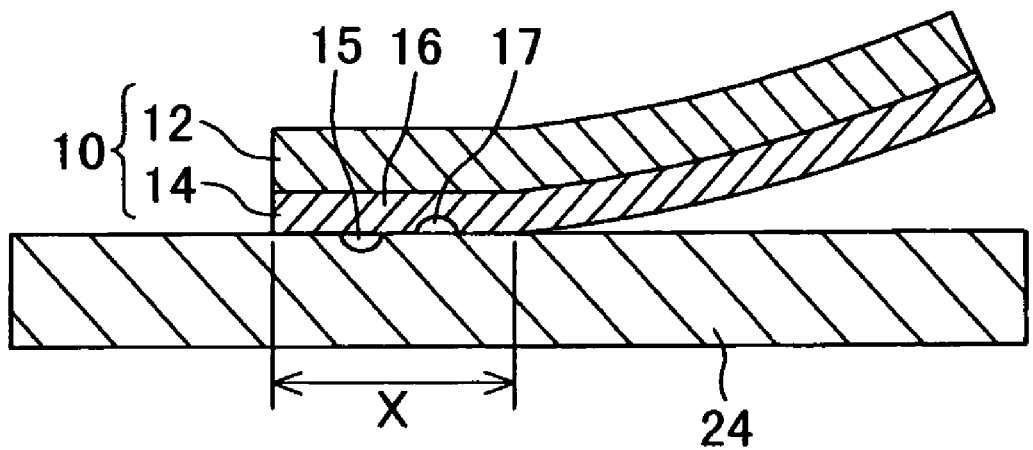
FIG. 16A and FIG. 16B are cross sectional views for explaining usage of the probe unit according to the embodiment of the present invention.
Figure 16B:
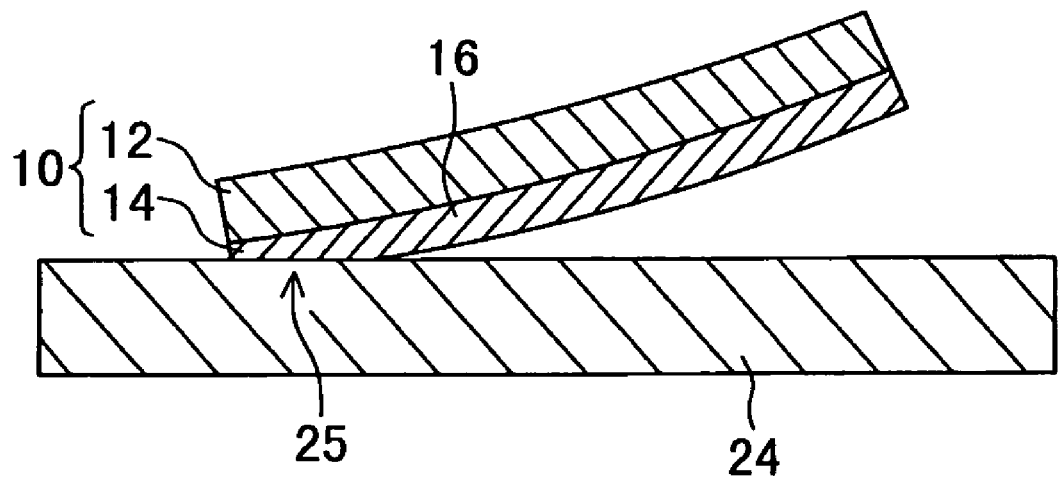
Figure 17A:
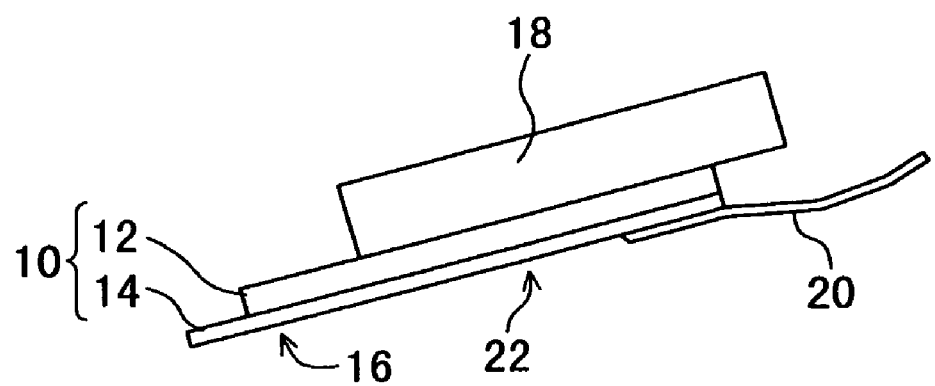
FIG. 17A and FIG. 17B are side views for explaining usage of the probe unit according to the embodiment of the present invention.
Figure 17B:
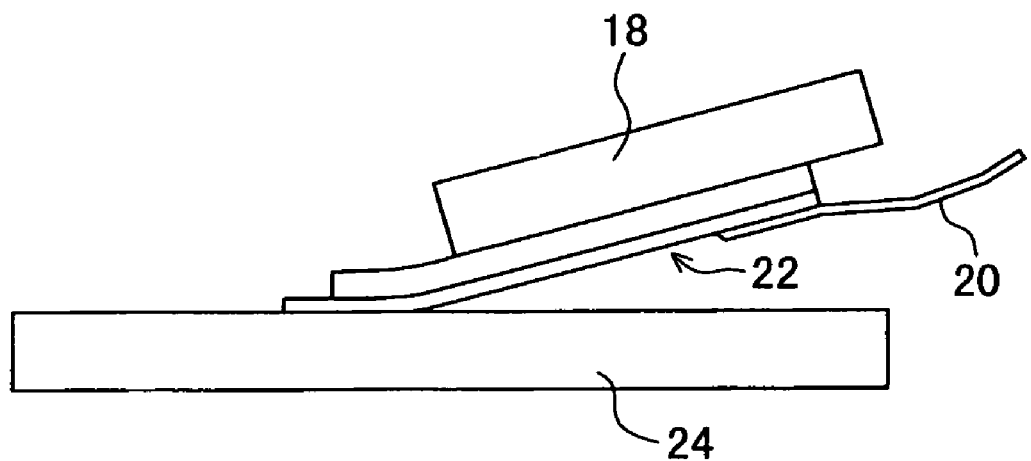

In addition, as shown in FIG. 16B, when a slope 25 is formed below the contact part 16, the electro conductive film 14 and the electrode 24 of the sample can be contacted in a wide area.

Further, when the substrate 12 is consisted of the inorganic substance with high rigidity, peeling off from the substrate 12 and the electro conductive film 14 can be prevented because contact pressure between the contact part 16 and the electrode 24 can be increased in a state of controlling bending of the substrate 12. Moreover, it is prevented that the electro conductive films 14 peels off from the substrate 12 by an external force that works on the probe unit 10 in a process of attaching the probe unit 10 on the fixture 18. Furthermore, since the electro conductive films 14 are formed on one surface of the substrate 12, each of the contact parts 16 that is a part of each electro conductive film 14 is pressured, and the electro conductive films 14 are hard to be peeled off from the substrate 12 even if the electro conductive films 14 are bent with the substrate 12. Also, as described above, when the electro conductive films 14 are detached from the substrate 12 in advance, effect to prevent the electro conductive films 14 from being peeled off from the substrate 12 will be increased more.

Figure 18:
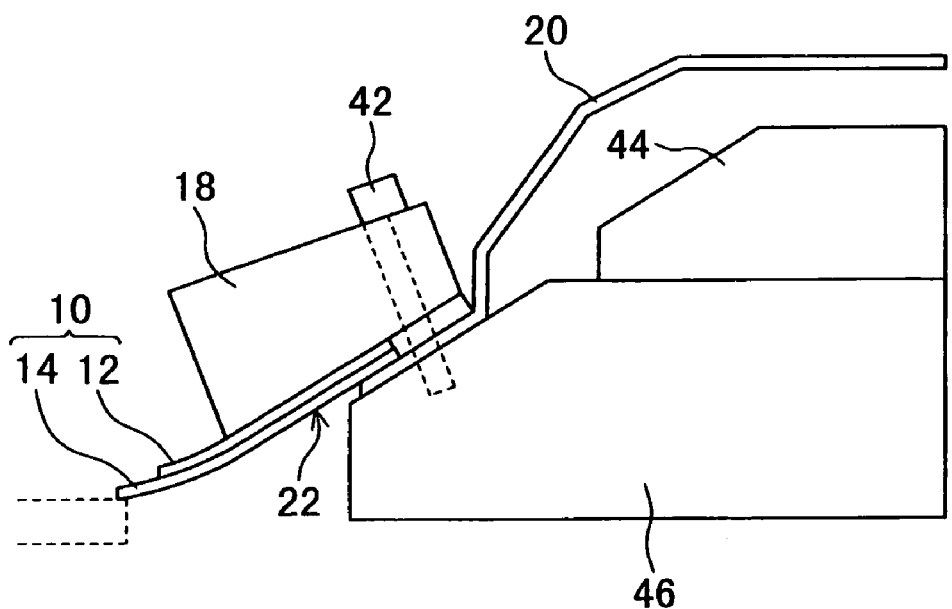
FIG. 18 is a side view showing usage of the probe unit according to the embodiment of the present invention.
Figure 19:
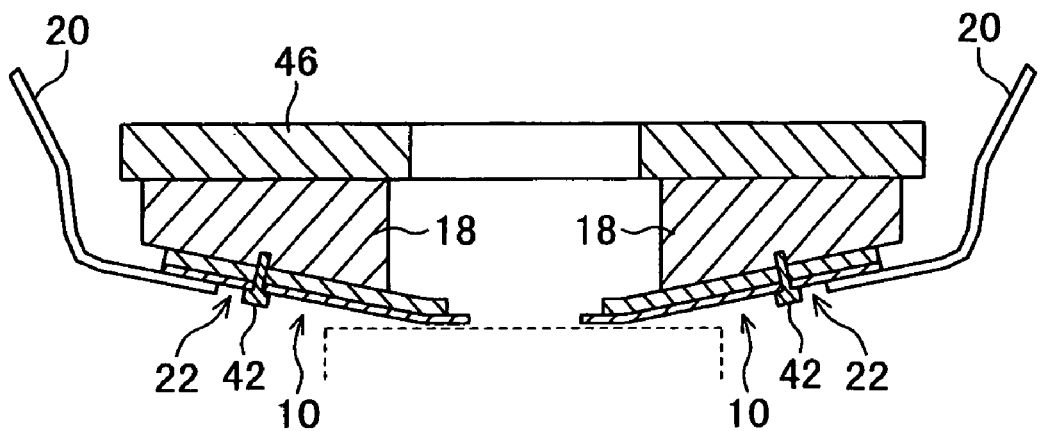
FIG. 19 is a cross sectional view showing usage of the probe unit according to the embodiment of the present invention.

FIG. 18 and FIG. 19 shows structures wherein the probe unit is attached to a main body (not shown in the drawing) of an inspection device. As shown in FIG. 18, by fixing the probe unit 10 at lower part of the fixture 18 and fixing the fixture 18 on an upper part of a base 46 with a screw or the like, the probe unit may be attached to the main body of the inspection device. The lead parts 22 of the probe unit 10 are electrically connected with a printed substrate 44 by a printed circuit board 20. Also, as shown in FIG. 19, by fixing the probe unit 10 at a lower part of the fixture 18 and fixing the fixture 18 on the lower part of the base 46 with the screw or the like, the probe unit may be attached on the main body of the inspection device.

Figure 20A:
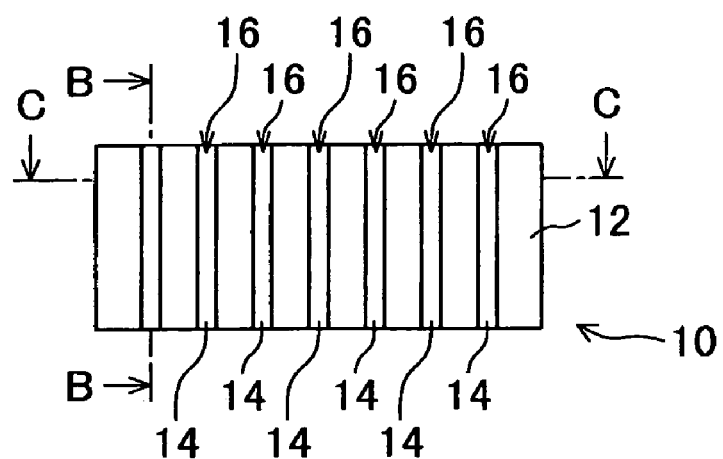
FIG. 20A is a plan view showing a probe unit according to a second embodiment of the present invention.
Figure 20B:
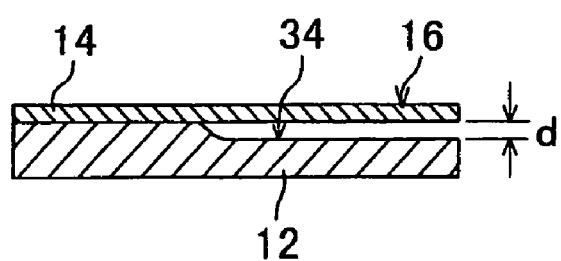
FIG. 20B is a cross sectional view along with a line B—B in FIG. 20A.
Figure 20C:
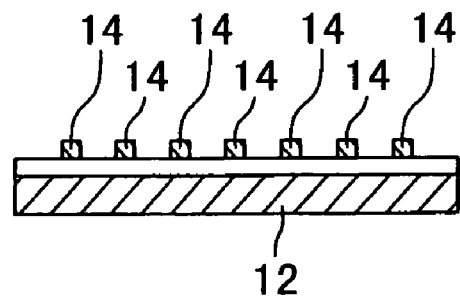
FIG. 20C is a cross sectional view along with a line C—C in FIG. 20A.

FIGS. 20A to 20C show a probe unit according to a second embodiment of the present invention. In the probe unit 10 according to the second embodiment of the present invention, the contact parts 16 of the electro conductive films 14 contacting with the electrodes of the sample are aligned on the surface of the edge of the substrate 12, and the contact parts 16 are detached from the surface of the substrate 12. A concave part 34 is formed at the edge of the substrate 12 so that an interval d between the contact parts 16 and the substrate 12 will be 0.01 μm to 300 μm.

Figure 21A:
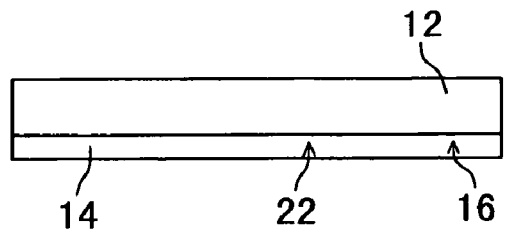
FIG. 21A to FIG. 21E are side views for explaining effect of the second embodiment of the present invention.
Figure 21D:
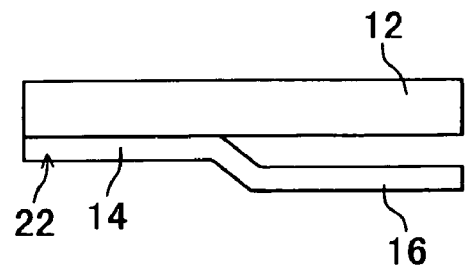
Figure 21B:
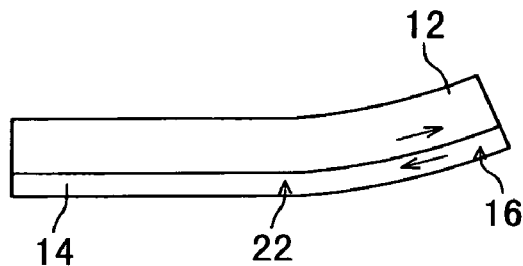
Figure 21E:
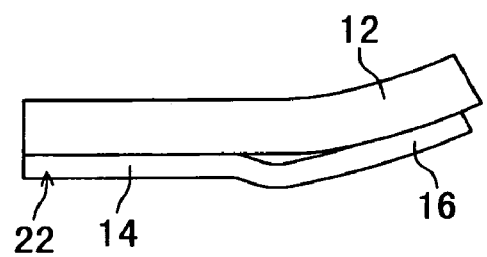
Figure 21C:
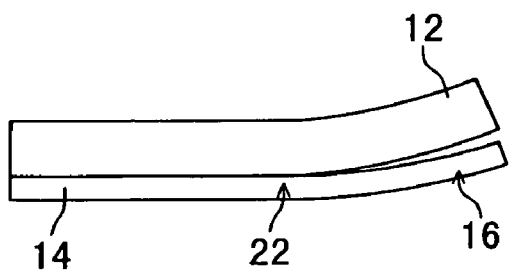

As shown in FIGS. 21A to 21C, if the contact parts 16 are attached to the substrate 12, shearing stress will be generated at the conjunctive parts between the electro conducting films 14 and the substrate 12 when the contact parts 16 and the substrate 12 deform together by overdrive. Shearing stress generated in the conjunctive parts of the electro conductive film 14 and the substrate 12 may cause peeling the electro conductive films 14 off from the substrate 12. On the other hand, in the second embodiment of the present invention, since the substrate 12 and the contact parts 16 are detached from each other as shown in FIGS. 21D and 21E, shearing stress will not be generated between the electro conductive film 14 and the substrate 12 even if the contact parts 16 and the substrate 12 are deformed. Therefore, when the contact parts 16 and the substrate 12 are detached, a resin having more deformation amount than an inorganic substance may be used for the substrate 12.

The probe unit 10 according to the second embodiment of the present invention is manufactured by modifying the manufacturing method of the above-described first embodiment.

Figure 22A:
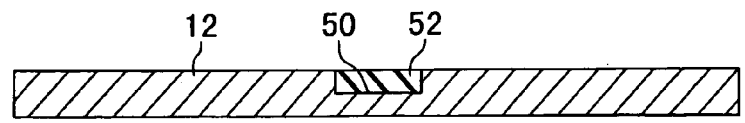
FIG. 22A to FIG. 22C are cross sectional views showing a manufacturing method of the probe unit according to the second embodiment of the present invention.
Figure 22B:
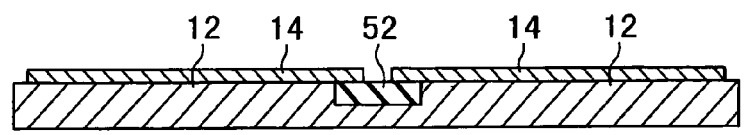

First, as shown in FIG. 22A and FIG. 22B, a sacrificial film 52 is formed in a concave part 50 formed on a substrate 12 that is formed in accordance with the above-described manufacturing method of the first embodiment, and the electro conductive films 14 whose tips extend to a surface of the sacrificial film 52 are formed on the surface of the substrate 12.

Next, the substrate 12 is thinned from backside until it becomes a predetermined thickness.

Figure 22C:
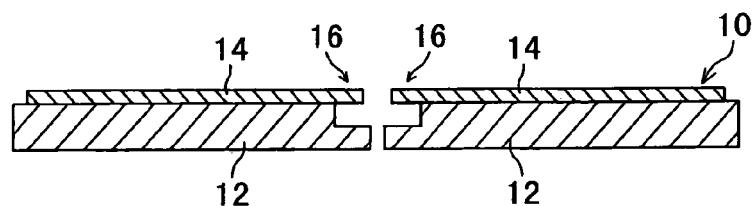

Next, as shown in FIG. 22C, the substrate 12 is cut by a dicing process into the finished products of the substrates 12. When the sacrificial film 52 is removed, a space between the tips (the contact parts) of the electro conductive films 14 and the substrate 12 is formed.

Further, instead of forming the outline of the finished product of the substrate 12 by the dicing process, by forming a bump in the concave part 50 filled up with the sacrificial film 52, the outline of the finished product of the substrate 12 may be formed when the sacrificial film 52 is removed.

Figure 23A:
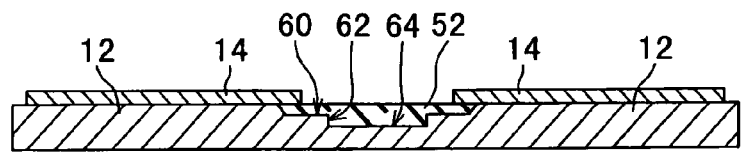
FIG. 23A to FIG. 23C are cross sectional views showing a manufacturing method of the probe unit according to the second embodiment of the present invention.
Figure 23B:
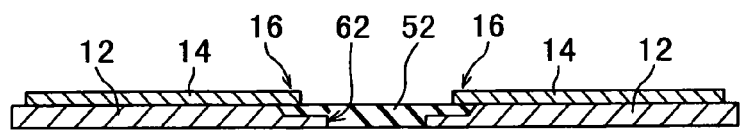
Figure 23C:
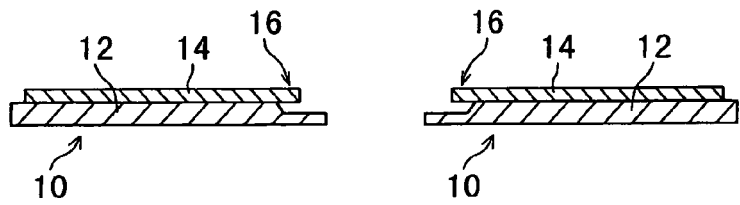

That is, as shown in FIG. 23A, a concave part 50 is formed based on the method according to the first embodiment of the present invention so that a sidewall 62 that falls from an upper surface 60 into a lower surface 64 is corresponding to the edge of the finished product of the substrate 12. Further, the substrate 12 is removed from backside to make it thin until the lower surface 64 of the concave part 50 is disappeared based on the method according to the first embodiment of the present invention as shown in FIG. 23B. Then, when the sacrificial films are removed, the sidewall 62 of the concave part 50 forms an edge surface of the substrate 12.

Figure 24A:
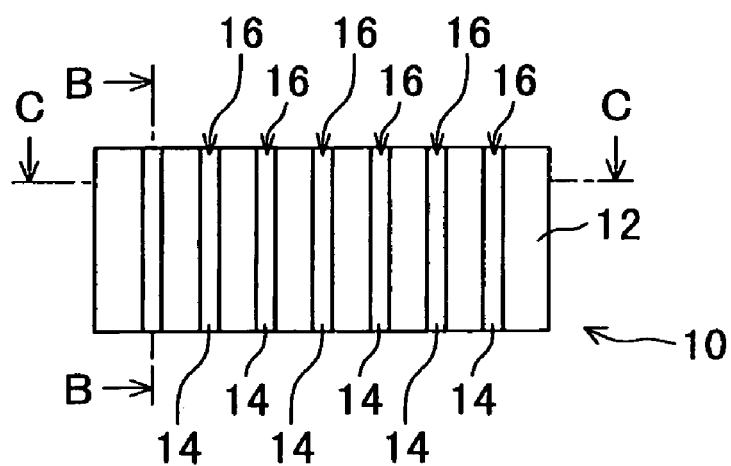
FIG. 24A is a plan view showing a probe unit according to a third embodiment of the present invention.
Figure 24B:
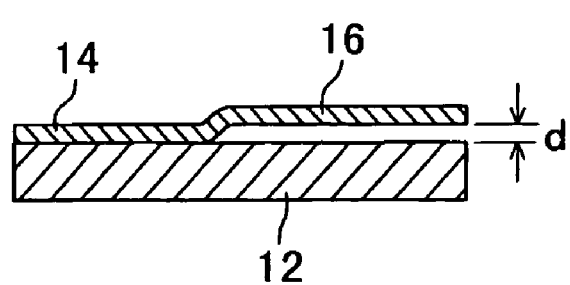
FIG. 24B is a cross sectional view along with a line B—B in FIG. 24A.
Figure 24C:
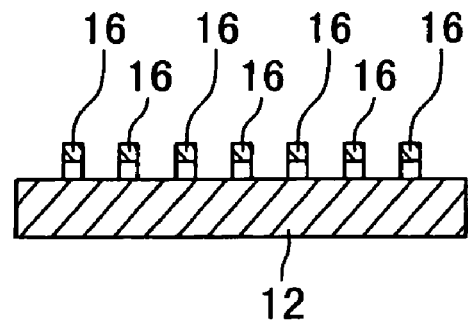
FIG. 24C is a cross sectional view along with a line C—C in FIG. 24A.

FIGS. 24A to 24C show a probe unit according to the third embodiment of the present invention. In the probe unit 10 according to the third embodiment of the present invention, the contact parts 16 of the electro conductive films 14 contacting with the electrodes of the sample are aligned on the surface of the edge of the substrate 12, and the contact parts 16 are detached from the surface of the substrate 12. In order to make a space d between the contact parts 16 and the substrate 12 from 0.01 μm to 300 μm, the tips of the electro conductive films 14 are bent like a step.

The probe unit 10 according to the third embodiment of the present invention is manufactured by modifying the manufacturing method of the above-described first embodiment.

Figure 25A:
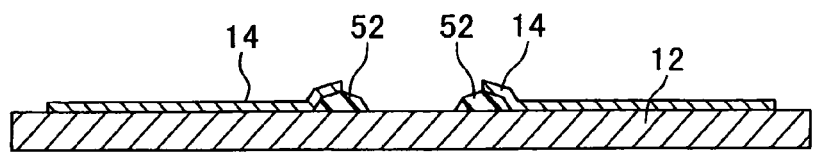
FIG. 25A to FIG. 25C are cross sectional views showing a manufacturing method of the probe unit according to the third embodiment of the present invention.

First, sacrificial films 52 are formed on a flat surface of the substrate 12. The sacrificial films 52 are formed where the electro conductive films 14 are detached from the substrate 12. Next, as shown in FIG. 25A, the electro conductive films whose tips are aligned on the surface of the sacrificial films 52 are formed on the surface of the substrate 12.

Figure 25B:
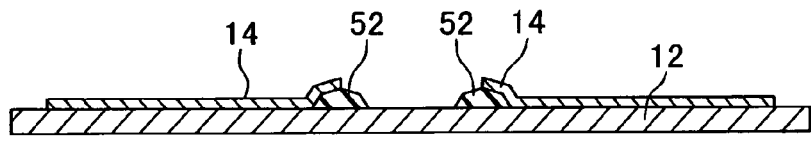

Next, as shown in FIG. 25B, the substrate 12 is thinned from backside until it becomes a predetermined thickness.

Figure 25C:
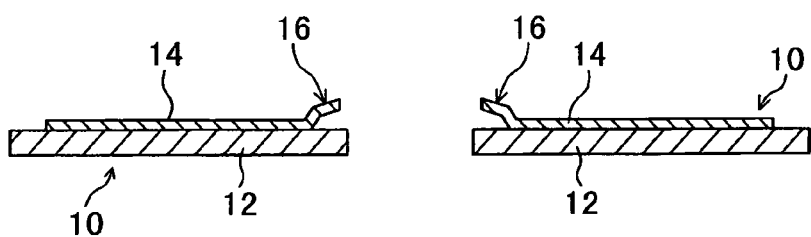

Next, as shown in FIG. 25C, the substrate 12 is cut by the dicing process and the like to form the outlines of the finished products of the substrates 12, and the sacrificial films 52 are removed to obtain the probe unit 10.

Figure 26A:
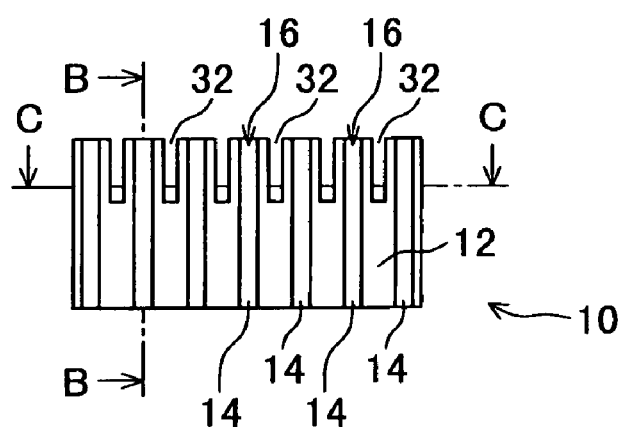
FIG. 26A is a plan view showing a probe unit according to a fourth embodiment of the present invention.
Figure 26B:
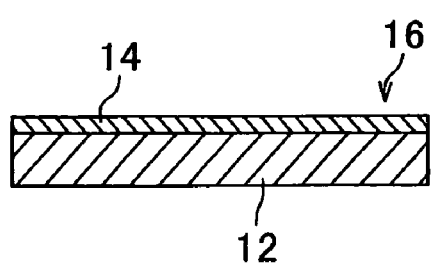
FIG. 26B is a cross sectional view along with a line B—B in FIG. 26A.
Figure 26C:
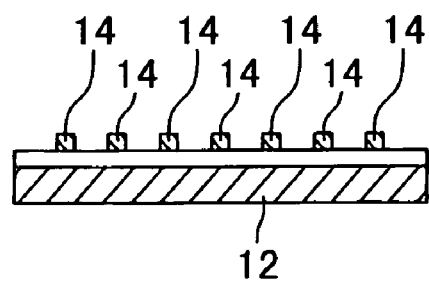
FIG. 26C is a cross sectional view along with a line C—C in FIG. 26A.

FIGS. 26A to 26C show a probe unit according to the fourth embodiment of the present invention. In the probe unit 10 according to the fourth embodiment, the contact parts 16 of the electro conductive films 14 contacting with the electrodes of the sample are formed at a comb-shaped edge of the substrate 12 consisted of an inorganic substance such as zirconia, and the contact parts 16 are not projecting from the edge of the substrate 12. Since the contact parts 16 and the lead parts 22 are formed on a same surface of the substrate 12, the lead parts 22 are hard to peel off from the substrate 12 when the substrate 12 is bent by pressing the surface of the contact parts 16. Also, since slits 32 are formed on the substrate 12, it will be easier for each contact part 16 to follow an electrode of a sample.

Figure 27A:
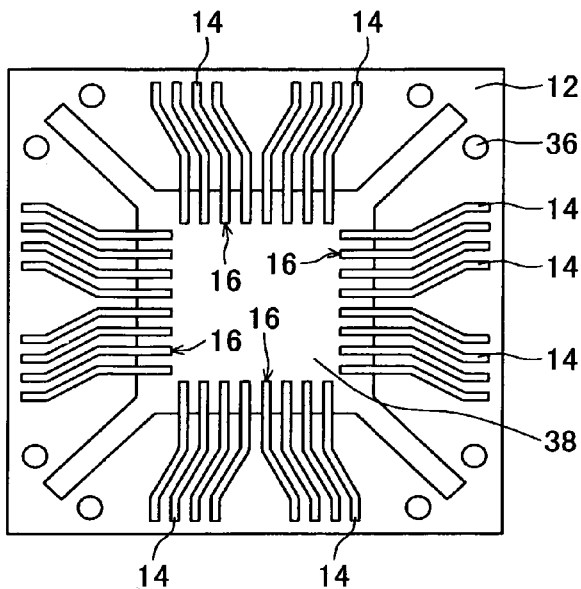
FIG. 27A is a plan view showing a probe unit according to a fifth embodiment of the present invention.
Figure 27B:
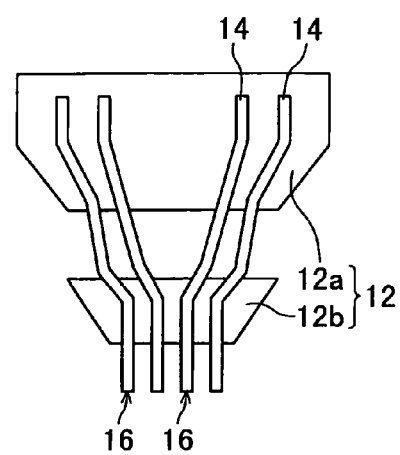
FIG. 27B is a plan view showing a probe unit according to a sixth embodiment of the present invention.
Figure 27C:
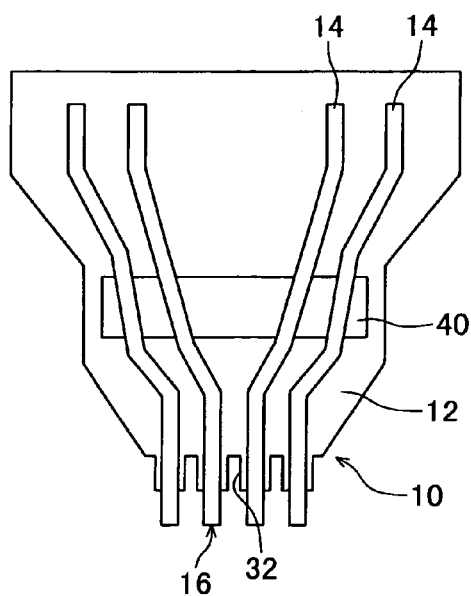
FIG. 27C is a plan view showing a probe unit according to a seventh embodiment of the present invention.

FIGS. 27A to 27C show probe units according to the fifth to seventh embodiments of the present invention. As the fifth embodiment of the present invention shown in FIG. 27A, a through hole 36 for positioning may be formed on the substrate 12. Also, the substrates 12 may be formed continuously in circle, and the opening 38 may be formed in the center of the circle. As the sixth embodiment of the present invention shown in FIG. 27B, the substrate 12 may be divided into plurality of parts 12a and 12b. As the seventh embodiment of the present invention shown in FIG. 27C, the electro conductive films may be formed crossing a through hole 40 of the substrate 12.

The present invention has been described in connection with the preferred embodiments. The invention is not limited only to the above embodiments. It is apparent that various modifications, improvements, combinations, and the like can be made by those skilled in the art.

What is claimed is:

1. A probe unit, comprising:
    a flexible substrate made of an inorganic substance and having an almost straight edge;
    an electro conductive film formed on a surface of the substrate and having a plurality of contact parts aligned on a surface of the edge and can contact with electrodes of a sample and lead parts connected to the contact parts, wherein
    the substrate is elastically deformed together with the contact part while the plurality of the contacts parts are supported by the edge when a force is added to press a surface of the contact part.

2. A probe unit according to claim 1, wherein the substrate is made of ceramics.

3. A probe unit according to claim 1, wherein the substrate is made of zirconia.

4. A probe unit according to claim 1, wherein the substrate is made of zirconia having thickness not more than 500 μm.

5. A probe unit according to claim 1, wherein the contact parts are not projected from the edge of the substrate.

6. A probe unit according to claim 1, wherein the contact parts are projected from the edge of the substrate.

7. A probe unit according to claim 1, wherein the surfaces of the contact parts are coated by metal films that are harder than base material.

8. A probe unit according to claim 1, wherein the surfaces of the contact parts are coated by metal films of which volume resistivity is smaller than that of base material.

9. A probe unit according to claim 1, wherein each of the surfaces of the contact parts has an inclined surface that is pressure-welded to a surface of an electrode of a sample almost in parallel to the surface of the electrode of the sample when the contact parts are pressure-welded to the electrodes of the sample.

10. A probe unit according to claim 1, wherein the substrate is made of a metal, and the probe unit further comprising an insulating film between the substrate and the electro conductive film.

11. A probe unit, comprising:
    a flexible substrate made of a non-organic substance and having an almost straight edge;
    an electro conductive film formed on a surface of the substrate and having a plurality of contact parts arranged to be detached from a surface of the edge and can contact with electrodes of a sample and lead parts connected to the contact parts, wherein
    the substrate is elastically deformed together with the contact part while the plurality of the contacts parts are supported by the edge when a force is added to press a surface of the contact part.

12. A method of fixing a probe unit according to claim 1 to a base of a main body of an inspecting device via a fixture, wherein the prove unit is fixed below the fixture so that the edge of the substrate projects from an edge of the fixture.

13. A method of manufacturing a probe unit, comprising the steps of:
    (a) preparing a flexible substrate made of an inorganic substance and having an almost straight edge;
    (b) forming a resist having an opening on a surface of the substrate; and
    (c) forming an electro conductive film having a plurality of contact parts aligned on a surface of the edge and can contact with electrodes of a sample and lead parts connected to the contact parts in the opening by plating.

14. A method of manufacturing a probe unit according to claim 13, further comprising the step of (d) thinning the substrate from a reverse side to make the probe unit thin after the step (c).

15. A method of manufacturing a probe unit according to claim 14, further comprising the step of (e) forming a protection film on the electro conductive film between the step (c) and (d).

16. A method of manufacturing a probe unit, comprising the steps of:
    (a) preparing a flexible substrate made of an inorganic substance and having an almost straight edge;
    (b) forming a resist having an opening on a surface of the substrate for exposing at least a part of the surface of the substrate; and
    (c) forming an electro conductive film formed on a surface of the substrate and having a plurality of contact parts arranged to be detached from a surface of the edge and can contact with electrodes of a sample and lead parts connected to the contact parts in the opening by plating.

* * * * *